(12) United States Patent
Apanius et al.

(10) Patent No.: US 8,120,168 B2
(45) Date of Patent: Feb. 21, 2012

(54) METHODS AND MATERIALS USEFUL FOR CHIP STACKING, CHIP AND WAFER BONDING

(75) Inventors: Chris Apanius, Moreland Hills, OH (US); Robert A. Shick, Brecksville, OH (US); Hendra Ng, Highland Heights, OH (US); Andrew Bell, Lakewood, OH (US); Wei Zhang, Brecksville, OH (US); Phil Neal, Wakeman, OH (US)

(73) Assignee: Promerus LLC, Brecksville, OH (US)

( * ) Notice: Subject to any disclaimer, the term of this patent is extended or adjusted under 35 U.S.C. 154(b) by 56 days.

(21) Appl. No.: 11/903,190

(22) Filed: Sep. 20, 2007

(65) Prior Publication Data

US 2008/0073741 A1 Mar. 27, 2008

Related U.S. Application Data

(63) Continuation-in-part of application No. 11/726,354, filed on Mar. 21, 2007.

(60) Provisional application No. 60/784,187, filed on Mar. 21, 2006.

(51) Int. Cl.
*H01L 23/10* (2006.01)
(52) U.S. Cl. . 257/710; 257/680; 257/729; 257/E31.117; 526/281
(58) Field of Classification Search ............... 257/710, 257/680, 729, E31.117; 526/281
See application file for complete search history.

(56) References Cited

U.S. PATENT DOCUMENTS

| 5,286,679 | A | | 2/1994 | Farnworth et al. |
| 5,436,492 | A | * | 7/1995 | Yamanaka ................ 257/433 |
| 5,529,959 | A | * | 6/1996 | Yamanaka ................ 438/64 |
| 5,769,696 | A | | 6/1998 | Lee et al. |
| 5,919,606 | A | * | 7/1999 | Kazlas et al. ............. 430/321 |
| 6,110,012 | A | | 8/2000 | Maury et al. |
| 6,903,171 | B2 | * | 6/2005 | Rhodes et al. ............ 526/171 |
| 2002/0102490 | A1 | * | 8/2002 | Ito et al. ................ 430/270.1 |
| 2003/0181554 | A1 | | 9/2003 | Faissat et al. |
| 2003/0181607 | A1 | * | 9/2003 | Rhodes et al. ............ 526/134 |
| 2004/0009683 | A1 | | 1/2004 | Hiraoka et al. |
| 2004/0036069 | A1 | * | 2/2004 | Barton et al. .............. 257/59 |
| 2004/0048994 | A1 | * | 3/2004 | Rhodes et al. ............ 526/171 |
| 2005/0078436 | A1 | | 4/2005 | Sturcken et al. |
| 2005/0085008 | A1 | | 4/2005 | Derderian et al. |
| 2005/0153522 | A1 | | 7/2005 | Hwang et al. |
| 2005/0164127 | A1 | * | 7/2005 | Reid et al. ............... 430/311 |
| 2005/0187398 | A1 | * | 8/2005 | Bell et al. ................ 556/136 |
| 2005/0221598 | A1 | | 10/2005 | Lu et al. |
| 2006/0035476 | A1 | | 2/2006 | Staines et al. |

FOREIGN PATENT DOCUMENTS

WO 2006029414 3/2006
WO 2006029414 A2 3/2006

* cited by examiner

*Primary Examiner* — Jarrett Stark
(74) *Attorney, Agent, or Firm* — The Webb Law Firm

(57) ABSTRACT

Materials, and methods that use such materials, that are useful for forming chip stacks, chip and wafer bonding and wafer thinning are disclosed. Such methods and materials provide strong bonds while also being readily removed with little or no residues.

12 Claims, 4 Drawing Sheets

METHODS AND MATERIALS USEFUL FOR CHIP STACKING, CHIP AND WAFER BONDING

CROSS-REFERENCE TO RELATED APPLICATIONS

The present invention is a continuation-in-part of U.S. patent application Ser. No. 11/726,354 filed Mar. 21, 2007, which claims the benefit of priority from U.S. Provisional Patent Application Ser. No. 60/784,187, filed Mar. 21, 2006, which are incorporated herein by reference.

TECHNICAL FIELD

The present invention relates generally to chip stacking, chip and wafer bonding and useful materials for forming such chip stacks and chip or wafer bonds, more specifically it relates to such methods and materials where the materials provide strong bonds while being readily removed with little or no residues, thus making such materials reworkable.

BACKGROUND

Historically, in semiconductor manufacture, single semiconductor die (or chips) were mounted within a sealed package and such package was then mounted to, for example, a circuit board. In such a manner various functionality or increased capacity could be provided for high level device such as a computer, a cell phone or the like. Which such packages, for example a dual inline package (DIP) or a single inline package (SIP), served to provide protection for the enclosed die from physical damage, contaminants in the surrounding environment and for providing electrical connection of the die to other electrical circuitry, such packages could also be bulky and require that the size of the circuit board or module be large enough to accommodate a plurality of such packages.

To reduce the size required by such singly packaged chips, recent trends have included the development of alternated packaging such a ball grid arrays, flip chips and the like. However, further reductions in size and the ability to provide increased and/or more complex functionality require alternate approaches to die packaging and mounting. One such alternate approach is to eliminate such singular packaging, where possible, and to mount die in multiples, for example as vertically oriented stacks of die. Such mounting in multiples, or stacking, while capable of providing a much reduced footprint compared the use of single packaged die, introduces a need to provide a method, and materials that can be employed by that method, for attaching each die in such a stack, to the adjacent die while also providing access to means for providing electrical contact to each die's circuitry. In addition, such materials used by such methods should also provide a stress buffer function, where they are used to attach such a chip or chip stack to a substrate having a different coefficient of linear expansion, and thus avoid damage to one or more of the chips or the substrate due to fluctuations in the environment.

Such chip stack mounting can also create a need to provide die that are thinned with respect to the original thickness of the wafer from which such die are provided. This thinning process can advantageously be used to keep the chip stack height to a minimum value, and also make it possible to provide through-chip vias that can provide for moving electrical contact from one surface of the die to the other surface. Therefore there is also a need to provide a method, and materials that can be employed by that method, that can be used to bond a substrate, such as a semiconductor wafer, to another substrate that is used in a wafer thinning process. Such material should provide a strong bond and protection for the bonded surface, while also providing for a readily implemented method of release of the wafer, and removal of such bonding material therefrom, after the thinning operation is complete.

It should be noted that while chip stacking is referred to as a recent trend, see published US Patent Application 2005/0078436, published Jan. 6, 2005 and entitled "Method For Stacking Chips Within A Multichip Module Package," the use of adhesive materials for attaching semiconductor die (chips) to substrates, die to lead frames or for chip stacking has been a subject of investigation for more than just a few years. For example, at column 3, lines 18-20 of U.S. Pat. No. 5,286,679 issued Feb. 15, 1994 and entitled "Method For Attaching A Semiconductor Die To A Leadframe Using A Patterned Adhesive Layer." However, despite this long know need, materials and methods that use such materials have not been widely adopted and therefore alternate materials and methods for both chip stacking and wafer thinning are needed.

BRIEF DESCRIPTION OF THE DRAWING

Embodiments of the invention are described below with reference to the following accompanying drawing.

DETAILED DESCRIPTION

Figure 1:
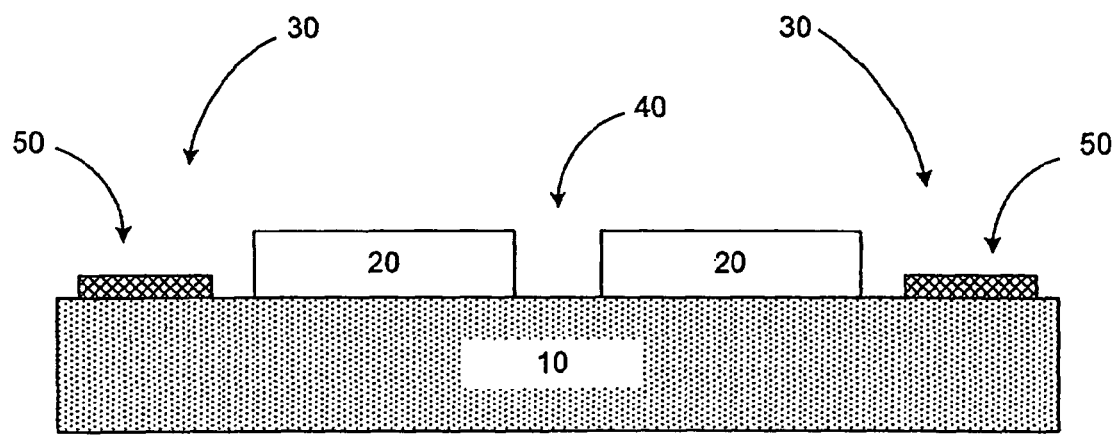
FIG. 1 is a simplified representation of a portion of an exemplary chip stacking embodiment in accordance with some embodiments of the present invention depicting a patterned polymer layer.

Other than in the operating examples, or where otherwise indicated, all numbers, values and/or expressions referring to quantities of ingredients, reaction conditions, etc., used in the specification and claims are to be understood as modified in all instances by the term "about."

Various numerical ranges are disclosed in this patent application. Because these ranges are continuous, unless specifically noted otherwise, they include the minimum and maximum values of each range and every value therebetween. Furthermore, unless expressly indicated otherwise, the various numerical ranges specified in this specification and in the claims are approximations that are reflective of the various uncertainties of measurement encountered in obtaining such values.

Embodiments, in accordance with the present invention, provide methods that utilize polymers encompassing a vinyl addition polymer with a backbone having two or more distinct types of repeat units derived from norbornene-type monomers, such monomers being independently selected from monomers represented by structural Formula I below:

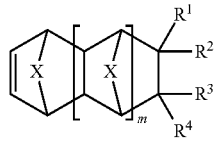
(I)

where a first distinct type of the repeat units encompasses at least one glycidyl ether functional pendant group and a second distinct type of the repeat units encompasses at least one aralkyl pendant group, and X, m, $R^1$, $R^2$, $R^3$, and $R^4$ are as defined below. The methods that utilize such polymers encompass polymer compositions for forming films having low internal stress, that are capable of being exposed to processing temperatures in excess of 300° C., that can be photodefined to form patterns, are capable of forming reliable bonds between electronic or optoelectronic devices or between such devices and substrates and where such compositions are photodefinable, commercial developers, such as cyclopentanone and methyl n-amyl ketone (2-heptanone) ("MAK") can be employed in a photodefining process.

As used above, and throughout the specification, the following terms, unless otherwise indicated, shall be understood to have the following meanings:

When referring to "vinyl addition polymers" in accordance with Formula I, it will be understood that such polymers encompass a backbone having two or more distinct or different repeat units. For example a polymer having two or more distinct types of repeat units can have two, three, four or more distinct types of repeat units.

By the term "derived" is meant that the polymeric repeating units are polymerized (formed) from polycyclic norbornene-type monomers, in accordance with Formula I, wherein the resulting polymers are formed by 2,3 enchainment of norbornene-type monomers as shown below:

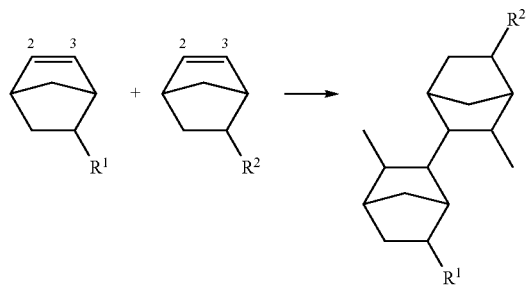

The term "polymer" is meant to include a vinyl addition polymerized polymer as defined above, as well as residues from initiators, catalysts, and other elements attendant to the synthesis of such polymer, where such residues are understood as not being covalently incorporated thereto. Such residues and other elements are typically mixed or co-mingled with the polymer such that they tend to remain with the polymer when it is transferred between vessels or between solvent or dispersion media.

The term "polymer composition" is meant to include the aforementioned polymer, as well as materials added after synthesis of the polymer. Such materials include, but are not limited to solvent(s), antioxidant(s), photoinitiator(s), sensitizers and other materials as will be discussed more fully below.

The term "solvent" when used to describe a component of the polymer composition, described above, is meant to include both reactive solvents and unreactive solvents (diluents).

The term "low K" refers in general to a dielectric constant less than that of thermally formed silicon dioxide (3.9) and when used in reference to a "low-K material" it will be understood to mean a material having a dielectric constant of less than 3.9.

The term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method D1708-95. Films having a low modulus are understood to also have low internal stress.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation.

The phrase "a material that photonically forms a catalyst" refers to a material that, when exposed to "actinic radiation" will break down, decompose, or in some other way alter its molecular composition to form a compound capable of initiating a crosslinking reaction in the polymer, where the term "actinic radiation" is meant to include any type of radiation capable of causing the aforementioned change in molecular composition. For example, any wavelength of ultraviolet or visible radiation regardless of the source of such radiation or radiation from an appropriate X-ray or electron beam source. Non-limiting examples of suitable materials that "photonically form catalyst" include photoacid generators and photobase generators such as are discussed in detail below. It should also be noted that generally "a material that photonically forms a catalyst" will also form a catalyst if heated to an appropriate temperature.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslink density of such crosslinkable components, i.e., the degree of crosslinking, is essentially 100% of complete crosslinking. In other embodiments, the crosslink density ranges from 80% to 100% of complete crosslinking. One skilled in the art will understand that the presence and degree of crosslinking (crosslink density) can be determined by a variety of methods, such as dynamic mechanical thermal analysis (DMTA) as discussed below. This method determines the glass transition temperature and crosslink density of free films of coatings or polymers. These physical properties of a cured material are related to the structure of the crosslinked network. Higher crosslink density values indicate a higher degree of crosslinking in the coating or film.

The term "bond" (or "bonding") as used in connection with the methods and polymer compositions described herein shall mean the bond formed between chips as in the chip stacking embodiments of the present invention as well as the bond formed between a wafer and a substrate as in the wafer thinning embodiments of the present invention. Further, it will be understood that such bonding is generally accomplished during a curing process such as described above.

The statements below, wherein, for example, $R^{23}$ and $R^{24}$ are said to be independently selected from a group of substituents, means that $R^{23}$ and $R^{24}$ are independently selected, but also that where an $R^{23}$ variable occurs more than once in a molecule, those occurrences are independently selected (e.g., if $R^1$ and $R^2$ are each epoxy containing groups of structural formula II, $R^{23}$ can be H in $R^1$, and $R^{23}$ can be methyl in $R^2$). Those skilled in the art will recognize that the size and nature of the substituent(s) can affect the number and nature of other substituents that can be present.

It should be noted that any atom with unsatisfied valences in the text, schemes, examples and tables herein is assumed to have the appropriate number of hydrogen atom(s) to satisfy such valences.

By "hydrocarbyl" is meant that the substituent is hydrogen or is composed solely of carbon and hydrogen atoms. As one skilled in the art knows, hydrocarbyl is inclusive of the following where the definitions apply regardless of whether a term is used by itself or in combination with other terms, unless otherwise indicated. Therefore, the definition of "alkyl" applies to "alkyl" as well as the "alkyl" portions of "aralkyl", "alkaryl", etc.

The term "alkyl" means an aliphatic hydrocarbon group that can be linear or branched acyclic or cyclic and comprises 1 to 25 carbon atoms in the chain. In one embodiment, useful alkyl groups comprise 1 to 12 carbon atoms in the chain. "Branched" means that one or more lower alkyl groups such as methyl, ethyl or propyl, are attached to a linear alkyl chain. The alkyl group can contain one or more heteroatoms selected from O, N and Si. Non-limiting examples of suitable alkyl groups include methyl, ethyl, n-propyl, isopropyl, n-butyl, t-butyl, n-pentyl, hexyl, heptyl, nonyl, decyl, cyclohexyl and cyclopropylmethyl.

"Aryl" means an aromatic monocyclic or multicyclic ring system comprising 5 to 14 carbon atoms, preferably 6 to 10 carbon atoms. The aryl group can contain one or more heteroatoms selected from O, N and Si. The aryl group can be substituted with one or more "ring system substituents" which may be the same or different, and include hydrocarbyl substituents. Non-limiting examples of suitable aryl groups include phenyl, naphthyl, indenyl, tetrahydronaphthyl and indanyl.

"Aralkyl" or "arylalkyl" means an aryl-alkyl-group in which both aryl and alkyl are as previously described. In some embodiments, useful aralkyls comprise a lower alkyl group. Non-limiting examples of such suitable aralkyl groups include benzyl, phenethyl and naphthlenylmethyl where the aralkyl is linked to the norbornene through the alkylene group. In some embodiments, the aralkyl group can contain one or more heteroatoms selected from O, N and Si.

"Cyclic alkyl" or cycloalkyl means a non-aromatic mono- or multicyclic ring system generally encompassing 3 to 10 carbon atoms, in some embodiments 5 to 10 carbon atoms and in other embodiments 5 to 7 carbon atoms. The cycloalkyl can be substituted with one or more "ring system substituents" which may be the same or different, and include hydrocarbyl or aryl substituents. Non-limiting examples of suitable monocyclic cycloalkyls include cyclopropyl, cyclobutyl, cyclopentyl, cyclohexyl and the like. Non-limiting examples of suitable multicyclic cycloalkyls include 1-decalinyl, norbornyl, adamantyl and the like. The cycloalkyl group can contain one or more heteroatoms selected from O, N and Si ("heterocyclyl"). Non-limiting examples of suitable monocyclic heterocyclyl rings include piperidyl, pyrrolidinyl, piperazinyl, morpholinyl, thiomorpholinyl, thiazolidinyl, 1,3-dioxolanyl, 1,4-dioxanyl, tetrahydrofuranyl, tetrahydrothiophenyl, tetrahydrothiopyranyl, and the like.

The names "glycidyl methyl ether norbornene" and "methyl glycidyl ether norbornene" are used interchangeably herein and refer to the same monomer or derived repeat unit. The terms "octyl epoxy norbornene" and "epoxy octyl norbornene" are used interchangeably herein and refer to the same monomer or derived repeat unit.

As previously mentioned, embodiments in accordance with the present invention are directed to methods that utilize polymer compositions encompassing a vinyl addition polymer. Such polymer further encompassing a backbone having two or more distinct types of repeat units derived from norbornene-type monomers, such monomers being independently selected from monomers in accordance with Formula I:

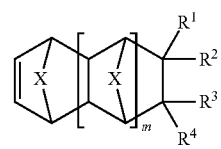

(I)

where X is selected from —$CH_2$—, —$CH_2$—$CH_2$— and —O—; m is an integer from 0 to 5, in some cases 0 to 3, and in other cases 0 to 2 and each occurrence of $R^1$, $R^2$, $R^3$, and $R^4$ is independently selected from one of the following groups:

H, $C_1$ to $C_{25}$ linear, branched, and cyclic alkyl, aryl, aralkyl, alkaryl, alkenyl, and alkynyl; or $C_1$ to $C_{25}$ linear, branched, and cyclic alkyl, aryl, aralkyl, alkaryl, alkenyl, and alkynyl containing one or more hetero atoms selected from O, N, and Si; or a glycidyl ether moiety in accordance with Formula II:

(II)

where A is a linking group selected from C1 to C6 linear, branched, and cyclic alkylene and $R^{23}$ and $R^{24}$ are each independently selected from H, methyl, and ethyl; or any combination of two of $R^1$, $R^2$, $R^3$, and $R^4$ linked together by a linking group selected from $C_1$ to $C_{25}$ linear, branched, and cyclic alkylene and alkylene aryl; and with the proviso that one of the at least two distinct types of monomers in accordance with Formula I encompasses at least one glycidyl ether pendant group and another of the at least two distinct types of monomers encompasses at least one aralkyl pendant group.

Generally, the two or more distinct types of repeat units of embodiments in accordance with the present invention are derived from monomers in accordance with Formula I that include a glycidyl ether pendent group and an aralkyl pendent group. Some embodiments include repeat units derived from monomers having such aforementioned pendent groups in optional combination with one or more types of repeat units derived from hydrocarbyl substituted norbornene-type monomers.

Suitable monomers having a glycidyl ether pendent group are norbornene-type monomers represented by Formula I wherein one or more of $R^1$, $R^2$, $R^3$, and $R^4$ is independently a pendent group represented by Formula II:

(II)

where A is a linking group selected from $C_1$ to $C_6$ linear, branched, and cyclic alkylene and $R^{23}$ and $R^{24}$ are each independently selected from H, methyl, and ethyl. Non-limiting examples of suitable linking groups A include methylene, ethylene, propylene, isopropylene, butylene, isobutylene and hexylene. Non-limiting examples of useful glycidyl alkyl ether pendent groups include glycidyl methyl ether, glycidyl ethyl ether, glycidyl propyl ether, glycidyl isopropyl ether, glycidyl butyl ether, glycidyl isobutyl ether, glycidyl hexyl ether and mixtures thereof.

Suitable monomers having an aralkyl pendent group are norbornene-type monomers represented by Formula I wherein one or more of $R^1$, $R^2$, $R^3$, and $R^4$ is an alkaryl group such as benzyl, phenethyl and naphthlenylmethyl phenethyl.

Suitable monomers having an optional hydrocarbyl pendent group are norbornene-type monomers represented by Formula I wherein one or more of $R^1$, $R^2$, $R^3$, and $R^4$ is each independently selected from hydrogen, linear and branched ($C_1$ to $C_{20}$)alkyl, hydrocarbyl substituted and unsubstituted ($C_5$ to $C_{12}$)cycloalkyl, hydrocarbyl substituted and unsubstituted ($C_6$ to $C_{40}$)aryl, hydrocarbyl substituted and unsubstituted ($C_7$ to $C_{15}$)aralkyl, ($C_3$ to $C_{20}$)alkynyl, linear and branched ($C_3$ to $C_{20}$)alkenyl or vinyl; any of $R^1$ and $R^2$ or $R^3$ and $R^4$ can be taken together to form a ($C_1$ to $C_{10}$)alkylidenyl group, $R^2$ and $R^4$ when taken with the two ring carbon atoms to which they are attached can represent saturated or unsaturated cyclic groups containing 4 to 12 carbon atoms or an aryl ring containing 6 to 17 carbon atoms; and m is 0, 1, 2, 3, 4 or 5.

For some suitable monomers, m is zero. Therefore, such monomers are represented by Formula (III) below:

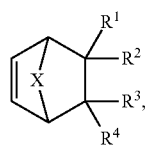

(III)

where X, $R^1$, $R^2$, $R^3$, and $R^4$ are as discussed above.

In some embodiments of the present invention, a polymer is employed that has a first type of distinct repeat unit derived from a norbornene-type monomer where X is —$CH_2$—, m is zero, three of the groups $R^1$, $R^2$, $R^2$ and $R^4$ are each H and the fourth is a glycidyl ether containing group in accordance with Formula II in which A is alkylene and $R^{23}$ and $R^{24}$ are each H. Exemplary monomers include, but are not limited to glycidyl alkyl ether norbornene-type monomers, such as glycidyl methyl ether norbornene, glycidyl ethyl ether norbornene, glycidyl propyl ether norbornene, glycidyl isopropyl ether norbornene, glycidyl butyl ether norbornene, glycidyl isobutyl ether norbornene, and/or glycidyl hexyl ether norbornene.

In some embodiments, the polymer employed has a second type of distinct repeat unit derived from a norbornene-type monomer where X is —$CH_2$—, m is zero, three of the groups $R^1$, $R^2$, $R^2$ and $R^4$ are each H and the fourth is an aralkyl group such as benzyl, phenethyl and naphthlenylmethyl phenethyl.

In some embodiments, the polymer employed has a third type of distinct repeat unit derived from a norbornene-type monomer where X is —$CH_2$—, m is zero, three of the groups $R^1$, $R^2$, $R^2$ and $R^4$ are each H and the fourth is a linear or branched alkyl group. Non-limiting examples include n-butyl, neopentyl, hexyl, decyl or dodecyl.

In an exemplary embodiment in accordance with the present invention, the polymer employed has a first distinct type of repeat unit derived from glycidyl methyl ether norbornene (GMENB) or epoxy octyl norbornene (EONB) and a second distinct type of repeat unit is derived from phenethyl norbornene (PENB). The amount of the first distinct type of repeat unit encompassed in the polymer can range from 10 to 50 mole percent (mol %) on a basis of total mole percent of the monomers used to prepare the polymer, where the second distinct type of repeat unit encompasses the remainder of the total amount of repeat units in the polymer. In other embodiments, the amount of the first distinct type of repeat unit can range from 20 to 40 mol %.

In another exemplary embodiment of the present invention, the polymer employed has a first distinct type of repeat unit derived from GMENB or EONB, a second distinct type of repeat unit is derived from PENB and a third distinct type of repeat unit derived from decyl norbornene (decyl NB) or dodecyl norbornene (dodecyl NB). The amount of the first distinct type of repeat unit encompassed in the polymer can range from 10 to 40 mol %, the amount of the second distinct type of repeat unit can range from 5 to 50 mol %, and the amount of the third distinct type of repeat unit can range from 20 to 65 mol %, all on the basis of total mole percent of the monomers used to prepare the polymer.

In yet another exemplary embodiment of the present invention, the polymer employed has a first distinct type of repeat unit derived from GMENB or EONB, a second distinct type of repeat unit is derived from PENB, a third distinct type of repeat unit derived from decyl NB or dodecyl NB and a fourth distinct type of repeat unit derived from trimethoxysilyl norbornene (TMSNB), triethoxysilyl norbornene (TESNB) or trimethoxysilyl ester norbornene (TMSESNB). The amount of the first distinct type of repeat unit encompassed in the polymer can range from 10 to 40 mol %, the amount of the second distinct type of repeat unit can range from 5 to 50 mol %, the amount of the third distinct type of repeat unit can range from 20 to 65 mol % and the amount of the fourth distinct type of repeat unit can range from 2 to 15 mol %, all on the basis of total mole percent of the monomers used to prepare the polymer.

Advantageously, the exemplary polymers described above each encompass repeat units selected to provide the polymer with appropriate properties. For example, polymers having repeat units derived from GMENB or EONB, when suitably catalyzed crosslink with the pendent groups of other repeat units to advantageously result in crosslinked polymer portions that are resistant to being dissolved in some solvents. In this manner, a means for forming a pattern is provided where a polymer film is imagewise exposed to activating radiation and non-exposed, non-crosslinked polymer portions are removed by being dissolved in an appropriate solvent. Such polymers having repeating units derived from decyl NB or dodecyl NB, as well as monomers having other alkyl pendent groups, provide a means for tailoring the modulus and internal stress of the final polymer film. It has been found that such alkyl repeat units are also related to the polymer's strength of adhesion to a substrate and the tackiness of the polymer during post bond and pre-cure processing. It should be noted, that the advantages of the several types of repeat units, discussed briefly above, are non-limiting examples and that the exemplary repeat units can have other advantages and that other types of repeat units can have similar or other advantages.

Monomers used to form the polymers employed in embodiments in accordance with the present invention are polymerized in solution in the presence of an appropriate polymerization catalyst. Vinyl addition catalysts useful in preparing polymers in accordance with embodiments of the present invention have recently become known and include, for example, such catalysts represented by the formula: $E_n Ni(C_6F_5)_2$ where n' is 1 or 2 and E represents a neutral 2 electron donor ligand. When n' is 1, E preferably is a π-arene ligand such as toluene, benzene, and mesitylene. When n' is 2, E is preferably selected from diethyl ether, THF (tetrahydrofuran), ethyl acetate, and dioxane. The ratio of monomer to catalyst in the reaction medium can range from 5000:1 to 50:1 in an exemplary embodiment of the invention, and in another exemplary embodiment can range from a ratio of 2000:1 to 100:1. The polymerization is generally conducted in a suitable solvent at an appropriate temperature in the range from 0° C. to 70° C., although other temperatures lower or high can also be appropriate. In some embodiments, the temperature can range from 10° C. to 50° C., and in other embodiments from 20° C. to 40° C. Polymerization catalysts of the above formula that can be used to make polymers in accordance with embodiments of the present invention include, but are not limited to, (toluene)bis(perfluorophenyl) nickel, (mesitylene)bis(perfluorophenyl) nickel, (benzene)bis(perfluorophenyl) nickel, bis(tetrahydrofuran)bis(perfluorophenyl) nickel, bis(ethylacetate)bis (perfluorophenyl) nickel, and bis (dioxane)bis(perfluorophenyl) nickel. Other useful vinyl-addition catalysts include the nickel compounds disclosed in PCT WO 97/33198 and PCT WO 00/20472.

Suitable solvents used for the vinyl addition polymerization of such monomers include, but are not limited to, hydrocarbon and aromatic solvents. Hydrocarbon solvents useful in the invention include, but are not limited to, to alkanes and cycloalkanes such as pentane, hexane, heptane, and cyclohexane. Non-limiting examples of aromatic solvents include benzene, 1,2-dichlorobenzene, toluene, methylethylketone (MEK), xylene, and mesitylene. Other organic solvents such as diethyl ether, tetrahydrofuran, acetates, e.g., ethyl acetate, esters, lactones, ketones, amides, and methylene chloride are also useful. Mixtures of one or more of the foregoing solvents can be utilized as a polymerization solvent.

Advantageously, the average molecular weight (Mw) of the polymers resulting from the polymerization methods described above, can be readily controlled. For example, such control can be obtained by changing the monomer to catalyst ratio. Thus, all other things being the same, a polymerization using a monomer to catalyst ratio of 5000:1 will result in a polymer having a higher Mw then where such ratio is 100:1. In addition, control of a polymer's Mw to the range of from about 10,000 to 500,000 or more, by carrying out the polymerization in the presence of a chain transfer agent (CTA). Exemplary CTAs can be, for example, compounds having a terminal olefinic double bond between adjacent carbon atoms, wherein at least one of the carbon atoms adjacent the double bond has two hydrogen atoms bonded thereto.

Useful CTA compounds are represented by the Formula IV:

where R' and R" are each independently selected from hydrogen, branched or unbranched ($C_1$ to $C_{40}$) alkyl, branched or unbranched ($C_2$ to $C_{40}$) alkenyl, or halogen. Of the above chain transfer agents the α-olefins having 2 to 10 carbon atoms are preferred, e.g., ethylene, propylene, 4-methyl-1-pentene, 1-hexene, 1-decene, 1,7-octadiene, and 1,6-octadiene, or isobutylene.

While the optimum conditions for employing an olefinic CTA to obtain a specific result can be readily determined experimentally by a skilled artisan, we have learned that, in general, α-olefins (e.g., ethylene, propylene, 1-hexene, 1-decene, 4-methyl-1-pentene) are the most effective olefinic CTAs with 1,1-disubstituted olefins (e.g., isobutylene) being less efficient. In other words, all other things being equal, the concentration of isobutylene required to achieve a given molecular weight will be much higher than if ethylene were the CTA selected.

As previously mentioned, polymer encompassed by embodiments in accordance with the present invention have excellent physical properties, particularly for use in photodefinable compositions for electrical or electronic devices. Such properties include, but are not limited to, low moisture absorption (less than 2 weight percent), low dielectric constant (less than 3.9), low modulus (less than 4 GigaPascal (GPa)), cure temperatures compatible with the processing of electronic and optoelectronic devices and solubility of non-crosslinked polymers, or non-crosslinked portions of polymer films, in many common organic solvents which include common photolithographic developers.

In some embodiments of the present invention, the polymer composition used encompasses a low K polymer, that is to say a cured polymer, film, layer or structure having a dielectric constant of less than 3.9 that is formed by means of photodefining such polymer. In some embodiments, such cured polymer, film, layer or structure can have a dielectric constant as low as 2.5, in some cases 2.3, and in other cases 2.2. It will be understood that a dielectric constant in the above range is sufficiently low to provide reduction of transmission delays and alleviation of crosstalk between conductive lines in electrical and/or electronic devices. The dielectric constant of the polymer, the polymer composition, photodefinable polymer compositions containing the polymer composition, and/or cured layers and/or films derived from such photodefinable polymer compositions can vary between any of the values recited above.

The polymers used in embodiments in accordance with the present invention advantageously have a low modulus. Thus some cured polymers, films, layers or structures formed in accordance with the present invention have a modulus less than 4.0 GPa and as low as 0.3 GPa, others as low as 0.2 GPa, and still others as low as 0.1 GPa. As a skilled artisan knows, if the modulus is too high, such a high modulus film will generally also have high internal stress which can lead to reliability issues, e.g., die cracking in an electronics package.

In other exemplary cured polymers, films, layers or structures, the level of moisture absorption is generally less than 2 weight percent, in some cases less than 0.8 weight percent, and in other cases less than 0.3 weight percent. As used herein, "moisture absorption" is determined by measuring weight gain of a sample in accordance with ASTM D570-98.

The cured polymers, films, layers or structures formed in accordance with embodiments of the present invention advantageously have a glass transition temperature (Tg) from at least 170° C., in some cases at least 200° C., and in some cases at least 220° C. to as high as 350° C. In some embodiments Tg is as high as 325° C., in other embodiments as high as 300° C., and in some embodiments as high as 280° C. Advantageously, such high $T_g$ allows for the use of the cured polymers, films, layers or structures in a wide variety of applications and devices. As a non-limiting example, a Tg at or above 300° C. and in some cases at or above 350° C. is sufficient to allow for successful solder reflow processing during such as is used for the packaging of microelectronic devices such as ICs. The glass transition temperature of the polymer can vary between any of the values indicated above. As referred to herein, Tg is determined using Dynamic Mechanical Analysis (DMA) on a Rheometric Scientific Dynamic Analyzer Model RDAII available from TA Instruments, New Castle, Del. according to ASTM D5026-95 (temperature: ambient to 400° C. at a rate of 5° C. per minute).

The cured polymers, films or layers also exhibit good bond strength after appropriate processing. That is to say, some embodiments of the present invention result in bonds that have a bond shear strength of at least 10 MPa, while other embodiments result in bonds that have a bond shear strength of at least 20 MPa. As referred to herein, the bond shear strength is determined using a Quad Group, Romulus III-A Universal Materials Tester having Zeta datalog/statistics system Version 4.4 software. Die Shear Head 2182 was used to run the programmed Die Bond Breaking Point Test with the speed set to fast and force set to 980 Newtons.

As previously mentioned, polymers employed in the embodiments of the present invention have a weight average molecular weight (Mw) of from 10,000 to 500,000. For some embodiments, it is advantageous for the polymer employed to have a Mw of from at least 30,000, for others from at least 60,000 and in still others from at least 90,000. It is also advantageous for some such embodiments to limit the upper range of the polymer's Mw to up to 400,000, in others to up to 250,000 and in still others to up to 140,000, where Mw is determined by gel permeation chromatography (GPC) using poly(styrene) standards. It will be understood that the Mw selected of a polymer employed in any embodiment in accordance with the present invention will be so selected to be sufficient to provide the desired physical properties in the cured polymer, films, layers or structures derived therefrom. In addition, it will be understood that the Mw of the polymer incorporated within such embodiments can vary between any of the Mw values provided above.

The polymer compositions used in any of the embodiments in accordance with the present invention encompass an amount of polymer sufficient to provide the above-described desired physical properties to the resulting composition, as well as coated layers and cured layers formed from such compositions. For exemplary polymer compositions useful for embodiments of the present invention, the polymer is advantageously present in an amount of at least 10 wt %, in others at least 15 wt %, and in still others at least 25 wt % of the photodefinable polymer composition. It is also advantageous for some such compositions to limit the upper range of polymer to an amount of up to 60 wt %, in others up to 50 wt %, and in still others up to 40 wt % of the polymer composition. The amount of the polymer present in the polymer composition can vary between any of the values recited above where such amount is selected based on the requirement of the specific application and the method by which the polymer composition is to be applied to a substrate. Further, it will be understood that while many of the polymer compositions useful for embodiments of the present invention are photodefinable compositions, other useful polymer composition are not.

Such aforementioned polymer compositions also encompass an appropriate solvent selected from reactive and/or non-reactive compounds to serve as a carrier for the polymer and other additives used to form polymer compositions. Such a solvent can be one or more un-reactive compounds such as hydrocarbon solvents, aromatic solvents, cycloaliphatic cyclic ethers, cyclic ethers, acetates, esters, lactones, ketones and amides or reactive compounds such as aliphatic mono- and multivinyl ethers, cycloaliphatic mono- and multivinyl ethers, aromatic mono- and multivinyl ethers and cyclic carbonates. It will be understood, therefore, that in some cases the solvent can be selected from only non-reactive compounds, in other cases from only reactive compounds and in yet other cases from a mixture of both reactive and non-reactive compounds. Also, in any of the aforementioned cases, the solvent can further encompass any single compound or any mixture of appropriate compounds. Particular non-limiting examples of appropriate solvents include un-reactive compounds such as cyclohexene, benzene, toluene, xylem, mesitylene, tetrahydrofuran, anisole, terpenenoids, bis(4-vinyloxyphenyl)methane, cyclohexanone and 2-heptanone (MAK); and reactive compounds such as cyclohexene oxide, α-pinene oxide, 2,2'-[methylene-bis(4,1-phenyleneoxymethylene)]bis-oxirane and 1,4-cyclohexanedimethanol divinyl ether.

In addition, in some exemplary embodiments, the reactive diluents include one or more compounds selected from epoxides and compounds described by structural units VI and VII:

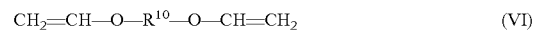

$$CH_2=CH-O-R^{10}-O-CH=CH_2 \hspace{2em} (VI)$$

$$CH_2=CH-O-R^{11} \hspace{2em} (VII)$$

where $R^{10}$ is a linking group selected from $C_1$ to $C_{20}$ linear, branched, and cyclic alkyl, alkylene, arylene and alkylene aryl, alkylene oxide containing from 2 to 6 carbon atoms, poly(alkylene oxide), wherein the alkylene portion of the repeat groups contain from 2 to 6 carbon atoms and the poly(alkylene oxide) has a molecular weight of from 50 to 1,000, $-[-R^{13}-N-C(O)-O-]_m-R^{13}-$, wherein each occurrence of $R^{13}$ is independently selected from $C_1$ to $C_{20}$ linear, branched, and cyclic alkylene, arylene, and alkylene aryl, and m is an integer of from 1 to 20; and $R^{11}$ is selected from $C_1$ to $C_{20}$ linear and branched, alkyl, and alkylol.

Other exemplary reactive diluents include one or more materials selected from phenyl vinyl ether, 1,4-butanediol divinyl ether, 1,6-hexanediol divinyl ether, 1,8-octanediol divinyl ether, 1,4-dimethanolcyclohexane divinyl ether, 1,2-ethylene glycol divinyl ether, 1,3-propylene glycol divinyl ether, ethyl vinyl ether, propyl vinyl ether, butyl vinyl ether, isobutyl vinyl ether, cyclohexyl vinyl ether, octyl vinyl ether, decyl vinyl ether, dodecyl vinyl ether, octadecyl vinyl ether, 1,4-butanediol vinyl ether, 1,6-hexanediol vinyl ether, and 1,8-octanediol vinyl ether.

In forming such polymer compositions, the aforementioned solvent is generally present in an amount from at least 15 wt % to as much as 90 wt % of the composition. In some embodiments a lower limit of from at least 30 wt % is appropriate and in still other embodiments from at least 50 wt % of the composition. The amount of solvent present in such photodefinable polymer compositions can vary between any of the values recited above such that the composition's properties are appropriate for the method selected for coating a substrate therewith and for providing a layer having an appropriate thickness thereof. Where the aforementioned solvent includes a reactive compound, such compound is generally present in an amount from at least 0.5% to 100% of solvent used to form the polymer composition. In some such embodiments it is advantageous for the lower limit to be from at least 2.5 wt %, in still others from at least 7.5 wt %. Non-limiting examples of such properties include viscosity and the evaporation rate of the solvent.

Since the polymer compositions used in the embodiments of the present invention encompass a solvent, such embodiments are typically in liquid form at ambient temperatures, and have appropriate amounts of polymer, solvent and other additives to provide a solution viscosity in the range of from at least 100 centipoise (cps) to up to 25,000 cps. Such solution viscosity is generally determined at 25° C. using an appropriately selected spindle mounted to a Brookfield DV-E viscometer, available from Brookfield Engineering Laboratories, Middleboro, Mass. It will be noted that the solution viscosity of embodiments in accordance with the present invention is a characteristic that is controlled by varying the concentrations of the several components of such compositions, such components including, but not limited to the aforementioned polymer and solvent, where variations of the solvent can include variations in the ratio of reactive and non-reactive compounds If both are present. Further, selecting a suitable solution viscosity is a function of, at least, the method to be used for coating the substrate with the polymer composition and the thickness of the resulting layer/film that is desired. Thus while a broad range of solution viscosity is provided above, it will be understood that the specific solution viscosity of an polymer composition embodiment can have any value that falls with such range.

Further, such polymer compositions can also encompass a material that photonically forms a catalyst, where the catalyst formed serves to initiate crosslinking of the polymer. Suitable materials that photonically form a catalyst include, but are not limited to, photoacid generators and photobase generators.

Where such a polymer composition encompasses a material that photonically forms a catalyst, such compositions can be directly photodefinable compositions in that where a layer of such a composition is imagewise exposed to appropriate actinic radiation, such catalyst is formed only in those portions of the film exposed to such radiation. Such photodefinable embodiments are generally negative-working photosensitive polymer compositions useful in a wide variety of electronic and opto-electronic applications. Some non-limiting examples of such applications include patterned bonding layers applied to a semiconductor wafer having openings formed therein that correspond to regions employed for electrical contact and/or die singulation. Further to such exemplary embodiments, the photodefinable polymer composition can form a dielectric layer or structure for the packaging of integrated circuits to protect against environmental and mechanical stresses. Additionally, such embodiments are useful for conventional, chip scale, and wafer level packaging of logic devices such as microprocessors, Application Specific Integrated Circuits (ASICs), discrete, memory, and passive devices as well as a variety of display devices and other optoelectronic devices that would benefit from such a layer. For example, some display or optoelectronic devices include a sensor array or image sensing portion therein. Advantageously, polymer composition embodiments of the present invention can be employed to form a structure proximate to such array or portion such that a glass or plastic cover can be fixably coupled to such structure such that the cover is spaced from such array or portion. In such embodiments the polymer composition employed serves to provide for appropriate spacing of the cover from such sensor array or image sensing portion and/or fixable attachment thereof. Thus, the photodefinable polymer compositions can be used in the fabrication of any of a wide variety of microelectronic, electronic or optoelectronic devices that would benefit from the incorporate of such a photodefinable polymer composition as a layer, film or structure.

When a photoacid generator is incorporated into a polymer composition of the present invention as the material that photonically forms a catalyst, such photoacid generator can include one or more compounds selected from onium salts, halogen-containing compounds, and sulfonates. Non-limiting examples of appropriate photoacid generators useful in embodiments of the present invention, include one or more compounds selected from 4,4'-ditertiarybutylphenyl iodonium triflate; 4,4',4"-tris(tertiary butylphenyl)sulphonium triflate; diphenyliodonium tetrakis(pentafluorophenyl)sulphonium borate; triarylsulphonium-tetrakis(pentafluorophenyl)-borate; triphenylsulfonium tetrakis(pentafluorophenyl) sulphonium borate; 4,4'-ditertiarybutylphenyl iodonium tetrakis(pentafluorophenyl) borate; tris(tertiary butylphenyl) sulphonium tetrakis(pentafluorophenyl) borate, and 4-methylphenyl-4-(1-methylethyl)phenyl iodonium tetrakis(pentafluorophenyl)borate.

Such photoacid generators are typically present at a level sufficient to promote or induce curing and crosslinking. For some embodiments in accordance with the present invention, such sufficient level is from at least 0.5 percent by weight (wt %) up to 10 wt %. In other embodiments a lower limit of from at least 0.75 wt % is appropriate and in still others from at least 1 wt % of the photodefinable polymer composition is appropriate. The amount of photoacid generator present in embodiments of the present invention can vary between any of the values recited above to meet the requirements of the application for which the photodefinable composition is intended.

It will be understood that the polymer compositions employed by exemplary embodiments of the present invention can include other suitable components and/or materials such as are necessary for formulating and using the photodefinable polymer compositions in accordance with the present invention. Such other suitable components and/or materials include one or more components selected from sensitizer components, reactive and non-reactive solvents, catalyst scavengers, adhesion promoters, antioxidants and the like.

Where appropriate, one or more sensitizer components can be included in photodefinable polymer compositions employed in embodiments of the present invention. Generally, sensitizers allow for a specific type or wavelength of actinic radiation to cause the photoacid or photobase generator to become effective for initiating crosslinking in the polymer included therein. Such suitable sensitizer components include, but are not limited to, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include 2-isopropyl-9H-thioxanthen-9-one, 4-isopropyl-9H-thioxanthen-9-one, 1-chloro-4-propoxythioxanthone, phenothiazine and mixtures thereof.

For polymer compositions, used in exemplary embodiments of the present invention that have both a material that photonically forms a catalyst and a sensitizer component, the latter can be present in the photodefinable polymer composition in an amount from at least 0.1 wt % to as much as 10 wt % of the composition. In other embodiments a lower limit from at least 0.5 wt % is appropriate, and in still others from at least 1 wt % of the photodefinable polymer composition. The amount of sensitizer component present in such photodefinable polymer compositions can vary between any of the values recited above.

In some embodiments according to the present invention, a catalyst scavenger is incorporated into the photodefinable polymer composition employed by such embodiment. Useful scavengers include acid scavengers and/or base scavengers. A non-limiting example of a suitable base scavenger that can be used in the present invention is trifluoro methylsulfonamide. Non-limiting examples of acid scavengers that can be used in the present invention include secondary amines and/or tertiary amines such as those selected from pyridine, phenothiazine, N-methylphenothiazine, tri(n-propyl amine), triethylamine, and lutidine in any of its isomeric forms.

For such photodefinable polymer compositions having both a material that photonically forms a catalyst and a catalyst scavenger, the latter can be present in the photodefinable polymer composition in an amount from at least 0.0005 wt % to as much as 5 wt % of the composition. In other embodiments a lower limit from at least 0.05 wt % is appropriate, and in still others from at least 0.25 wt % of the photodefinable polymer composition. The amount of catalyst scavenger present in such photodefinable polymer compositions can vary between any of the values recited above.

It has been found that for some embodiments of the present invention, it is advantageous to add an adhesion promoter to the polymer composition employed. Generally any such adhesion promoter compatible with the several other components of the polymer composition and the use such a composition is intended for can be used in the present invention. Suitable adhesion promoters improve the bond strength between a coated layer of photodefinable polymer composition and the substrate upon which it is coated. In an exemplary embodiment of the present invention, the adhesion promoter includes one or more compounds selected from 3-glycidoxypropyltrimethoxysilane, 3-glycidoxypropyltriethoxysilane, 3-aminopropyl triethoxysilane and compounds described by Formula V:

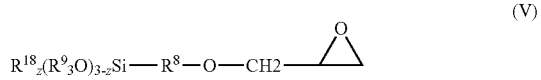

(V)

where z is 0, 1, or 2; $R^8$ is a linking group selected from $C_1$ to $C_{20}$ linear, branched, and cyclic alkylene, alkylene oxide containing from 2 to 6 carbon atoms, and poly(alkylene oxide), wherein the alkylene portion of the repeat groups contains from 2 to 6 carbon atoms and the poly(alkylene oxide) has a molecular weight of from 50 to 1,000; each occurrence of $R^9$ is independently selected from $C_1$ to $C_4$ linear and branched alkyl; and each occurrence of $R^{18}$ is selected from H and $C_1$ to $C_4$ linear and branched alkyl. It should be further noted that it has been found that for some embodiments of the present invention, an adhesion promoter can be incorporated into the backbone of the polymer used to form the polymer composition employed as an additional or alternate repeat unit derived from an appropriate monomer. Exemplary monomers that can be incorporated as repeat units in such polymers to provide adhesion promotion include, but are not limited to trimethoxysilyl norbornene, triethoxysilyl norbornene and trimethoxysilyl ethyl norbornene.

Exemplary polymers used to form the polymer compositions used in the embodiments of the present invention encompass at least two distinct types of repeat units derived from norbornene-type monomers represented by Formula I, shown above. Further descriptive of these embodiments is that one of such distinct types of norbornene-type monomers has at least one pendant group having an epoxy functional group, for example an alkyl glycidyl ether pendant group such as methyl glycidyl ether, or an epoxy alkyl pendent group such as epoxy octyl, and another of such distinct types has at least one aralkyl pendant group, for example a phenethyl pendant group.

Where such a polymer composition encompasses a polymer prepared from more than two distinct types of norbornene-type monomers, such monomers are distinct from the above described monomers. That is to say that such monomers have a pendent group that has different atoms or different numbers or positions of atoms from the monomers of such first and second types described above.

For illustrative purposes only, one exemplary photodefinable polymer composition includes a polymer prepared by the polymerization of a reactor charge encompassing the following three exemplary norbornene-type monomers, 30% decyl norbornene, 40% phenyl ethyl norbornene and 30% glycidyl methyl ether norbornene (mol %) and appropriate amounts of the following additives: Rhodorsil® PI 2074 (4-methylphenyl-4-(1 methylethyl)phenyliodonium tetrakis(pentafluorophenyl)borate) available from Rhodia; SpeedCure® CPTX 1-chloro-4-propoxy-9H-thioxanthone available from Lambson Group Inc.; phenothiazine (Aldrich Chemical Company), Irganox® 1076 antioxidant (3,5-di-tert-butyl-4-hydroxyhydrocinnamate) from Ciba Fine Chemicals; 1,4 dimethanolcyclohexane divinyl ether and 3-glycidoxypropyltrimethoxysilane (3-GTS or A-187). As will be seen in the examples that follow, the above polymer composition is but one of many possible and advantageous compositions. It will be understood that the additives shown above are not limiting on embodiments of the present invention. That is to say, that other specific additives can be employed in addition to, or in place of, any of the aforementioned additives. For example, rather than 3-GTS, any appropriate NXT silane, NXT*Z ethanol free silanes (both available from Momentive Performance Materials, Inc.), any appropriate sulfur-containing alkoxysilane or epoxide, such as those available from Degussa Corporation, Gelest, Inc., Sigma-Aldrich Inc. or the aforementioned Momentive Performance Materials, or others can be employed as an adhesion promoter. Similarly, the specific photoacid generator, sensitizer, acid scavenger and the like are also non-limiting and other appropriate materials can be employed in addition to or in place of such illustrative materials.

Embodiments in accordance with the present invention are directed to methods of forming a layer of a polymer composition on a substrate surface, where such composition can be photodefinable or not, and using such layer to form structures that are useful in semiconductor wafer processing and chip packaging. For example, a wafer thinning process or a planarization process employing a chemical mechanical polishing processes and/or chip packages having stacked chip arrays (see, FIG. 2, 5 or 6). As will be described below, some embodiments in accordance with the present invention include: providing a substrate, coating the substrate surface with the polymer composition to form a layer, imagewise exposing the layer to appropriate actinic radiation, developing a pattern by removing unexposed portions of the layer and curing the remaining portions to form a patterned layer or pattern of structures on the surface. Other embodiments while also including being exposed to actinic radiation, include a blanket exposure rather then an imagewise exposure, hence such embodiments do not generally include a develop step.

For some embodiments, it is advantageous to pretreat the substrate surface, just prior to the coating thereof, by exposing the substrate surface to a plasma discharge so that the adhesion of the polymer film to be formed thereon to the substrate surface is enhanced over a similar untreated surface. While it has been found that an oxygen plasma or an oxygen/argon plasma are both effective for treating a silicon substrate, a non-limiting example is exposing a surface of a silicon wafer substrate to an oxygen/argon plasma (50:50 percent by volume) for 30 seconds in a March RIE CS 1701 plasma generator at a power setting of 300 watts and a pressure of 300 mTorr, other appropriate gases or gas mixtures and other appropriate reactor conditions can be employed.

Any suitable method of coating may be used to coat the substrate with the polymer composition. In an exemplary embodiment, suitable coating methods include, but are not limited to, spin coating, dip coating, brush coating, roller coating, spray coating, solution casting, fluidized bed deposition, extrusion coating, curtain coating, meniscus coating, screen or stencil printing and the like. In exemplary embodiments of the present invention, spin coating is typically employed for forming films of the aforementioned polymer compositions because of its simplicity and compatibility with current micro-electronic processing.

In some embodiments, after coating the substrate with a layer of polymer composition, the layer is optionally first heated to a first temperature to remove essentially all of any residual solvents or other volatiles from the coated layer or film. Advantageously, such a first heating can also serve to relax any stress in the layer resulting from the coating process. Additionally, such heating can serve to harden the layer making it more durable than had no first heating been done. It is found that such first heating provides for more convenient handling during subsequent processing as well as a more uniform patterning of the layer.

Suitable conditions for such first heating include, but are not limited to, those sufficient for removing essentially all of any residual solvent from the layer while preventing such layer from undergoing any oxidative process or thermally initiated curing. While such first bake conditions will vary depending, in part, on the components of the polymer containing formulation, the following exemplary conditions are instructional. Such include, but are not limited to, appropriate times and temperatures from less than 1 minute to 30 minutes and from 75° C. to 150° C., respectively. In addition, suitable first heating conditions include heating in a vacuum, air or an inert gas atmosphere such as nitrogen, argon and helium.

The coated layer described above is then generally exposed to any suitable source of actinic radiation. In a non-limiting example, the actinic radiation is ultraviolet or visible radiation at a wavelength of from 190 nm to 700 nm, in some cases from 300 nm to 500 nm, and in other cases from 360 nm to 440 nm. In a further non-limiting example, the dose of such actinic radiation for exposing is from 50 $mJ/cm^2$ to 3,000 $mJ/cm^2$.

In some embodiments of the present invention, the layer is imagewise exposed by placing a photomask between the actinic radiation source and the layer such that only selected portions of the layer are exposed to the actinic radiation. In those portions of the layer that are exposed to the radiation, the material that photonically forms a catalyst initiates crosslinking of pendant epoxy groups incorporated in some of the repeat units of the polymer backbone. Such crosslinking converts the polymer material within the exposed portion to a generally solvent insoluble state. Non-exposed areas of the layer remain in their initial generally solvent soluble state thus allowing the use of a solvent (typically referred to as a developer) to readily remove the unexposed polymer material therein, resulting in the forming of a patterned layer or a pattern of structures disposed on the substrate as will be later shown.

After exposure to actinic radiation and before any develop step that may be performed, some embodiments of the present invention generally incorporate a post exposure bake. Such bake can be used to further promote crosslinking of pendant epoxy groups within exposed portions of the photodefinable layer, where the increased temperature of such bake serves to increase mobility of the acid species formed by the exposure, thus allowing such acid to find and react with remaining non-crosslinked epoxy groups and thus further the degree of crosslinking within such exposed areas. It should be understood that such increase crosslinking within the exposed portions can increase the difference in the solubility between exposed and non-exposed portions where such exposure was an imagewise exposure. Thus, pattern definition can be enhanced. In some embodiments of the invention, the post exposure bake is to a temperature from 75° C. to no more than 140° C. for a period of time between 1 minutes and 20 minutes. In other embodiments such bake is to a temperature from 85° C. to 110° C. for a period of time between 4 minutes and 10 minutes. Further, such post exposure bake is typically conducted under an inert atmosphere (e.g., nitrogen, argon, or helium).

In some embodiments of the present invention, after post exposure baking, methods of forming a photodefinable layer on a substrate include developing a pattern therein or structures thereof are employed. Generally such developing encompasses contacting the exposed layer with a suitable developer material. While any appropriate developer material may be used, appropriate developers being those materials that are able to remove soluble portions (e.g., non-crosslinked) portions of the layer. Such developers materials include, but are not limited to, solvents such as toluene, mesitylene, xylene, cyclopentanone and 2-heptanone (MAK).

Further, any suitable method for developing the aforementioned patterned layer of structures can be employed. Such suitable methods include, but are not limited to, spray, puddle, and/or immersion developing techniques. Spray development includes spraying a polymer coated substrate with a continuous stream of atomized or otherwise dispersed stream of developing solvent for a period of time sufficient to remove the non-crosslinked polymer (non-exposed) from the substrate. The polymer coated substrate can be subjected to a final rinse with an appropriate solvent such as an alcohol. The puddle and immersion technique involves puddling developing solvent over the entire patterned coating or immersing the patterned coated substrate into developing solvent to dissolve the non-crosslinked polymer, and then rinsing the developed substrate in additional developing solvent or another appropriate solvent (e.g., an alcohol). In all of the foregoing development techniques, the developed coated substrate can be spun at high speed to remove residual solvent and solute and optionally subjected to a post develop bake cycle at a temperature from 110° C. to 200° C. for a period of from 5 to 90 minutes.

Referring now to FIG. 1, a semiconductor substrate 10 having an imagewise exposed and developed layer (a patterned layer) of a photodefinable polymer composition thereon is depicted. As such figure shows, such patterned layer generally encompassing portions 20 of the polymer composition, overlying substrate 10, that are not removed by the develop process described above and gaps 30 and 40, representing other portions removed by such develop process. As shown, gaps 30 expose bonding pads 50 (also referred to as electrical contacting regions) and gaps 40 represent dicing lanes (used for die singulation). While FIG. 1 only depicts peripheral bonding or electrical contact areas and dicing lane openings, it will be understood that other areas may also be opened, such areas include, but are not limited to other electrical contact areas (i.e. "in-bond" regions) or imaging arrays (such as may be found on optoelectronic die).

Figure 2:
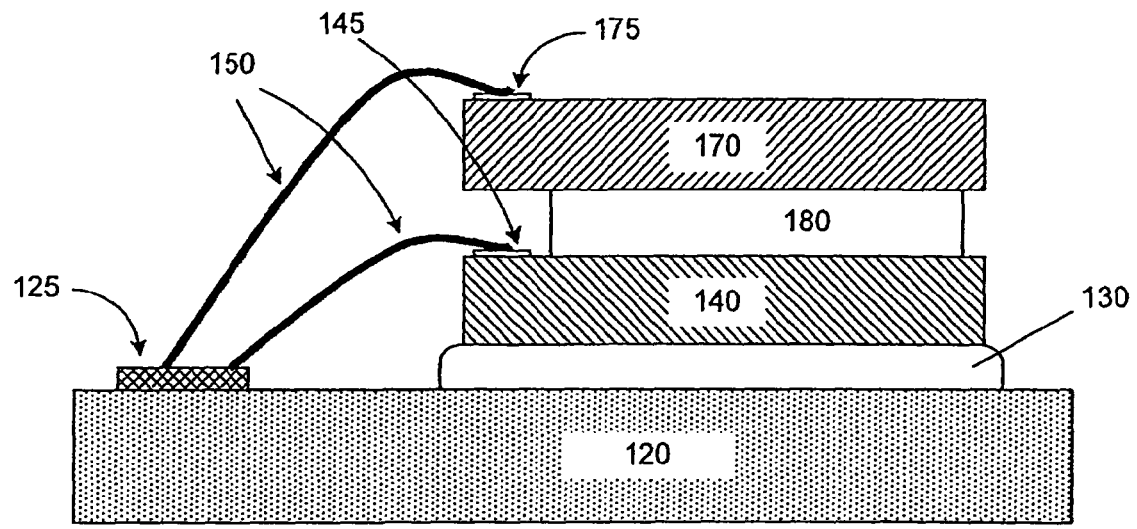
FIG. 2 is a simplified representation of a portion of another exemplary chip stacking embodiment in accordance with some embodiments of the present invention depicting two stacked die wire bonded to a substrate.

After the above described developing, embodiments in accordance with the present invention are optionally post develop baked and subsequently cured, where such curing is employed to bond a coated substrate to another substrate in the course of forming the structures depicted in FIGS. 2, 5 and 6.

In some embodiments, a two step curing cycle can be employed. For example, in a first curing cycle the polymer layer is heated to a first cure temperature from 110° C. to 300° C. for from 30 seconds to 120 minutes under a pressure from 5 to 100 psi. Such first cure cycle is employed to continue the crosslinking of the crosslinkable components, provide an initial sidewall profile for the photodefined features and/or structures and to form a first bond between the substrates. In a subsequent second curing cycle, embodiments of the present invention are heated to a second cure temperature, higher than the first cure temperature. Such second cure temperature is generally from 110° C. to 300° C. where such heating is continued for from 20 to 120 minutes, where again shorter and/or longer times can be appropriate. The effect of this second cure cycle is believed to complete the bonding of the substrates and to insure that the crosslinking of the crosslinkable components is essentially complete and thus providing that the desired mechanical, physical and chemical properties of the resultant film and/or structures. Non-limiting examples of such being bonding of the substrates to a desired shear strength, low moisture uptake properties, low modulus and resistance to some chemicals and a second sidewall profile are achieved. It should be noted that for such photodefined embodiments, an initial sidewall profile of photodefined features of generally at or close to vertical (90°) is altered by the second heating to a second sidewall profile that is more sloped, less than vertical, than the initial sidewall profile. Such second profile is advantageously from 60° to 85°.

In other embodiments, photodefined polymer compositions are cured using a single curing cycle. That is to say that such embodiments are heated to a temperature from 120° C. to 300° C. for 2 minutes to 10 hours under a pressure of from 5 to 100 psi. Such single cure cycle has been shown effective for providing the aforementioned desirable properties and additionally provides an initial sidewall profile that is less than vertical and generally from 60° to 85°. It will be understood that the times, temperatures and pressures provided in discussing the cure cycles are broad ranges meant only as guidance for a skilled artisan. Thus any and all times and temperatures within the broad ranges provided are within the scope and spirit of the present invention.

As mentioned above, such curing steps are generally used to cause the bonding of a coated substrate to another substrate. For example, referring to FIG. 2, the bonding of semiconductor die (chip) 140 to chip 170 by polymer portion 180. To generate this bonded structure, it has been found advantageous to apply pressure to the chips during at least a portion of the curing cycle. Thus as described above, the two step curing cycle provides for such pressure only during the first heating step while the one step curing cycle provides continuous pressure. Also seen in FIG. 2 is that chip 140 is fixably attached to substrate 120 by an attachment material 130 and that both chip 140 and 170 have wire bonds 150 to electrically couple bonding pads 145 of chip 140 and bonding pad 175 of chip 170 to bonding pad(s) 125 of such substrate. While attachment material 130 has not been discussed as being consistent with the polymer compositions described and used herein, it will be understood that material 130 could be so consistent and applied and formed on substrate 120 in a manner analogous to the forming of portions 20 depicted in FIG. 1.

When selected portions of the photodefinable layer have been exposed to actinic radiation and subsequently patterned and cured, the layer is in the form of a film or a plurality of structures covering at least a portion of a surface of the substrate. Generally, it is advantageous for the film and any resulting structures to have a desired thickness. As the processing of embodiments in accordance with the present invention can vary, and as this processing generally results in an initially applied thickness of a polymer composition disposed on a substrate being changed to a smaller, final thickness, it has been found that testing to determine the typical change in thickness allows for measuring the initial thickness as a means to obtain a desired final thickness. It will be noted that such testing, for example processing a layer of polymer composition disposed on a substrate through the entirety of the process, is well within the capability of a skilled artisan.

The desired final thickness can be any suitable thickness. That is to say any thickness that is appropriate for the specific microelectronic, electronic or opto-electronic application for which the film is to be used. For example, it will be understood that for an embodiment of the present invention that will electrically couple two or more die to a substrate using wire bonds, such as shown in FIG. 2, a thickness different from an embodiment that electrically couples such die through solder bumps or balls such as in a flip-chip configuration and also different from an embodiment involving a wafer thinning process. Thus, such varied embodiments can have a final film thickness from 5 microns (F) to 300 μl. In some embodiments such thickness is from 10μ to 100μ and in still others from 25μ to 75μ. Finally, it should be noted that the final film thickness obtained can vary within any of the ranges of values provided or any combination of such ranges.

As a result of exposure to actinic radiation and the various curing steps, the crosslinking reaction is essentially completed and the resulting patterned film and/or structures have a glass transition temperature (Tg) and a bond shear strength that is characteristic of the actual composition employed and the actual processing of the composition. In some embodiments of the present invention, after the final cure step, the Tg is generally greater than 275° C. and the bond shear strength is generally greater then or equal to 10 MPa, and often greater then that required to cause the substrate to which the material is fixed to, to fail.

Figure 3:
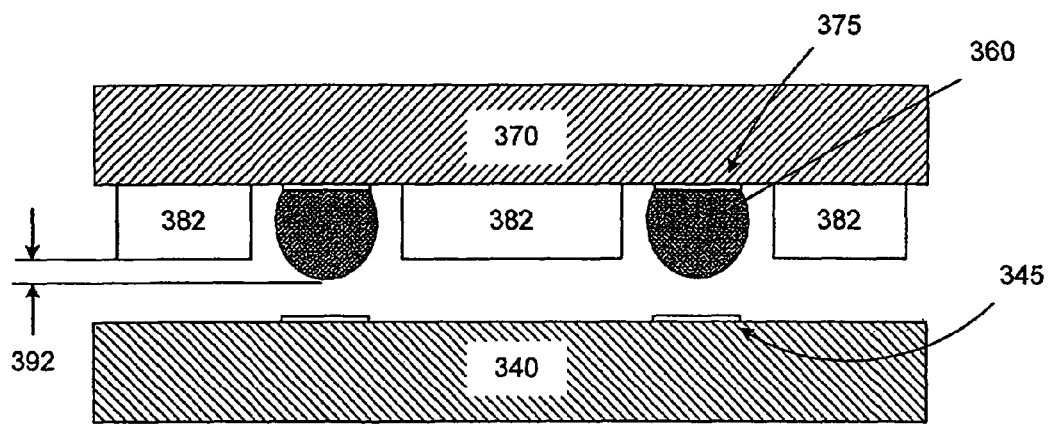
FIGS. 3 and 4 are simplified representations of portions of yet another exemplary chip stacking embodiment in accordance with some embodiments of the present invention depicting steps in the fabrication of two stacked die, a first flip chip die overlying and electrically coupled to a second die that is wire bonded to a substrate.
Figure 4:
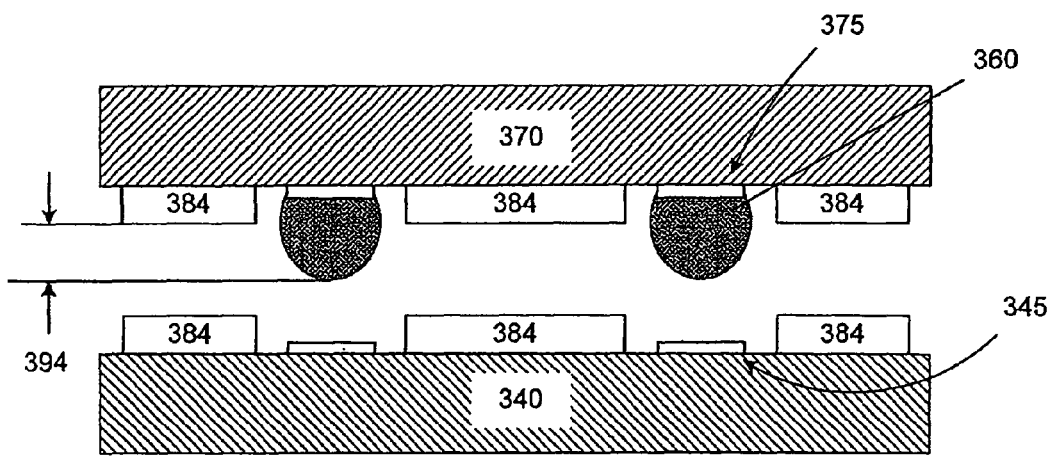

Referring now to FIGS. 3 and 4, alternate intermediate steps in the forming of another chip stack embodiment of the present invention are shown In FIG. 3, semiconductor die or chip 340 is shown having bonding pads or regions 345 overlying a surface of such chip. Chip 370 is shown having bonding pads 375 disposed between polymer regions 382. Also depicted are solder balls or bumps 360 fixably and electrically coupled to pads 375. While FIG. 3 is not to scale, it will be noted that solder balls 360 extend beyond adjacent polymer regions 382, in a vertical direction, by a first distance 392. Turning now to FIG. 4, alternate versions of chips 340 and 370 are depicted. As in FIG. 3, chips 340 and 370 of FIG. 4 each encompass bonding pads 345 and 375 respectively, and chip 370 further has solder ball or bump 360 fixably and electrically coupled to pads 375 in the same manner as shown in FIG. 3. In a manner alternative to that depicted in FIG. 3, however, each of chips 340 and 370 have polymer portions 384 disposed thereon, where such portions 384 are collectively essentially equivalent in thickness to polymer portion 382 of FIG. 3. Therefore each of portions 384 are thinner then portions 382 and hence second distance 394, the distance solder balls 360 extend beyond portions 384, is greater then first distance 392.

It should be noted that while forming the structure of FIG. 4 encompasses the extra steps needed to provide patterned polymer portions 384, as such portions are thinner then portions 382 of FIG. 3, portions 384 may be easier to form when small geometries are needed. Additionally, the forming of solder balls 360, accomplished by any appropriate method, may be easier to accomplish given thinner polymer portions 384 as compared to portions 382.

Figure 5:
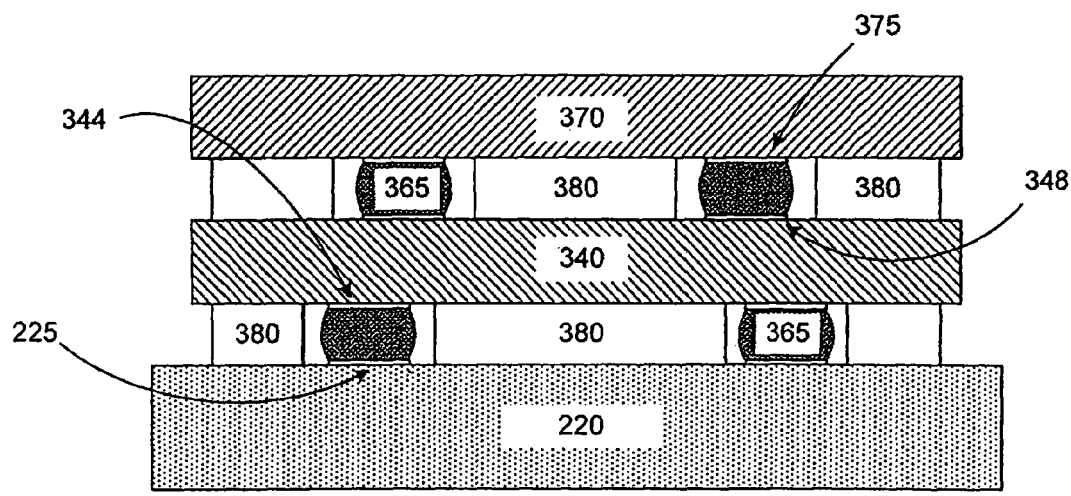
FIGS. 5 and 6 are simplified representations of portions of yet another exemplary chip stacking embodiment in accordance with some embodiments of the present invention depicting process steps in the fabrication of two stacked die, a first flip chip die overlaying coupled to a second flip chip die that overlays and is electrically coupled to a substrate.
Figure 6:
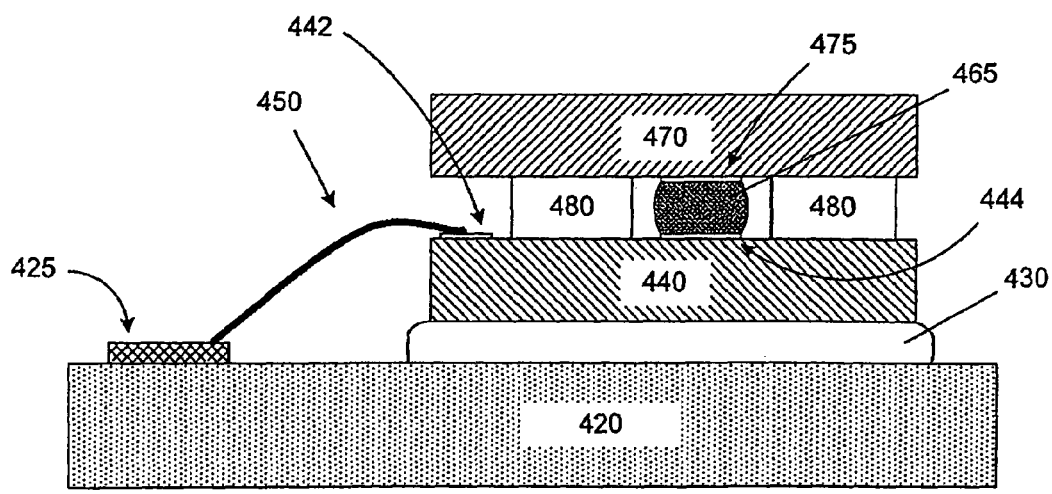

Referring now to FIGS. 5 and 6, still other chip stacking embodiments of the present invention are depicted. FIG. 5 depicts a two chip stack where semiconductor die or chip 370 is electrically coupled to die 340 through compressed solder balls 365 and fixably coupled to die 340 through polymer portions 380. It will be understood, that the fixable and electrical coupling is the result of bonding appropriate intermediate structures, in accordance with the structures depicted in either FIG. 4 or FIG. 3, where either a single step cure and bond process or a two step cure and bond process, as described above with respect to the structure of FIG. 2, is employed. However, as the intermediate structures of FIGS. 3 and 4 both encompass solder balls or bumps 360, while the structure of FIG. 2 does not have such bumps 360, the temperatures and compression force used for such bond and cure process should be appropriate for the particular solder material employed. Continuing with FIG. 5, such electrical coupling of chip 370 and chip 340 is through electrical contact of compressed solder ball 365 with both bonding pads 375 of chip 370 and bonding pads 348 of chip 340. As it should be seen, chip 340 encompasses bonding pads 348 and 344 overlying opposing surfaces of such chip and where only one of such pads is adjacent an "active" surface of such chip. That is to say, one of pads 344 or 348 is adjacent the surface of die 340 where the devices of such die are formed and the other is overlying the opposite surface. Any method of providing electrical coupling to the bonding pad overlying the inactive surface can be used to provide such electrical coupling, exemplary methods include, but are not limited to, "through chip vias" or "edge metallization".

Still referring to FIG. 5, it can be seen that substrate 220, having bonding pads 225 overlying an upper surface thereof, is electrically and fixably coupled to chip 340. The fixable coupling is the result of the bonding of chip 340 to substrate 220 through polymer portions 380 and the electrical coupling through compressed solder balls or bumps 365 to effect such coupling of bonding pads 225 and 344. It should be noted that in some embodiments of the present invention chips 340 and 370 will be first coupled and then second coupled to substrate 220, while in other embodiments, a single bond and curing process is employed to couple chips 340 and 370 with substrate 220 in a single process. Alternately, chip 340 and substrate 220 can be first coupled and then second coupled to chip 370.

Turning now to FIG. 6, yet another embodiment of the present invention is shown. It will be noted that the embodiment depicted in FIG. 6 encompasses portions of the embodiments depicted in FIG. 2 and FIG. 5. That is to say, the embodiment of FIG. 6 uses both wire bonding and compressed solder balls for electrical coupling. Specifically, substrate 420 is seen having bonding pads 425 formed thereon. Chip 440 encompasses wire bond pads 442 and solder bond pads 444, where pads 442 and 425 are electrically coupled through bond wire 450. Chip 440 is further fixably coupled to substrate 420 through attachment material 430 which is analogous to attachment material 130 (FIG. 2) and the discussion of alternatives for material 130 previously presented with the discussion of such figure. As seen chip 470, having bonding pads 475, is coupled electrically to chip 440 through compressed solder balls 465 and contact to solder bond pad 444. In addition chip 470 is fixably coupled to chip 440 through polymer material 480. Such fixable and electrical coupling is performed in a manner analogous to that discussed with respect to FIG. 5.

Advantageously, the polymers used to form the polymer compositions employed in embodiments of the present invention to form strong bonds between electronic or optoelectronic substrates can also be readily removed by the thermal decomposition of the cured/bonded material. Thus it has been found that where such materials are heated to a temperature in excess of 425° C. for an appropriate period of time, such polymer material can thermally decompose to leave virtually no residue. It will be understood that such a characteristic can be useful in the chip stacking embodiments of the present invention, previously described, in that such a characteristic allows for the recovery of valuable semiconductor die and other materials should such recovery become necessary. However, such characteristic also provides for alternate embodiments where having a removable bond between two substrates or a substrate and a fixture or a handle substrate is required.

While polymer compositions of the present invention are photodefinable by and through imagewise exposure and subsequent pattern development, in some embodiments it can be desirable to provide a non-imaged film. That is to say a layer or film that does not have a pattern formed therein or structures formed therefrom. Such non-imaged embodiments can be provided using the above described image development process where either the imagewise exposure is performed as a "blanket exposure" (all portions of the film are exposed to the actinic radiation) or where the film is not exposed at all to such actinic radiation. Where such a blanket exposure is employed, the image providing processes described above, without a developing step, will provide a fully cured film. Where no exposure to actinic radiation is used, the curing of the film will then be by only a thermal process. Thus an appropriate material that photonically forms a catalyst, i.e. a material that also thermally forms a catalyst, is included in the polymer composition and the curing temperatures and times adjusted, if found to be necessary, to fully cure the material. Suitable thermal acid generators include the onium salts, halogen containing compounds and sulfonates set forth above and suitable thermal curing agents or thermal acid generators include, but are not limited to, imidazoles, primary, secondary, and tertiary amines, quaternary ammonium salts, anhydrides, polysulfides, polymercaptans, phenols, carboxylic acids, polyamides, quaternary phosphonium salts, and combinations thereof. Finally, it should be noted that where a non-imaged film is prepared, such film can be patterned using any appropriate photolithographic imaging and patterning process. That is to say that a layer of a photoresist material can be disposed over a cured non-imaged layer, a pattern formed in the photoresist layer and the underlying non-imaged layer etched by any appropriate means.

Figure 7:
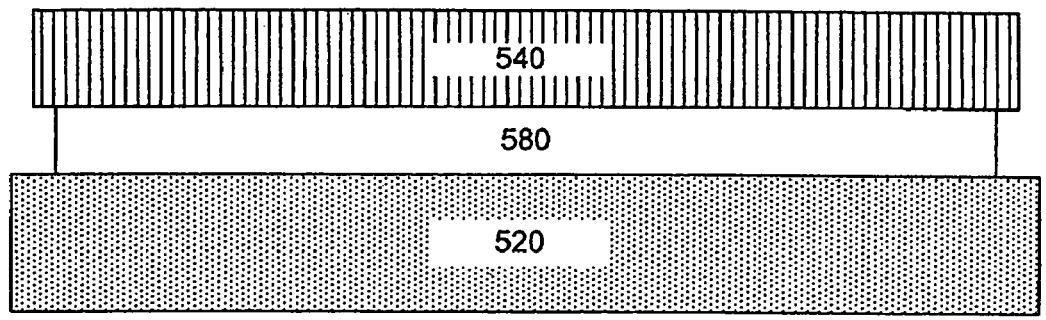
FIG. 7 is a simplified representation of a portion of still another embodiment in accordance with some embodiments of the present invention, depicting a device wafer removably bonded to a substrate or handle wafer.

For example, referring to FIG. 7, embodiments in accordance with the present invention that take advantage of such thermal decomposition are depicted. As shown, substrate 520 is coupled to semiconductor substrate or wafer 540 through polymer material 580. Where such embodiment is directed to a wafer thinning process, an active surface of wafer 540 is positioned facing substrate 520. Alternately, where such embodiment is a wafer planarization process, the active surface of wafer 540 is positioned facing away from substrate 520. Generally the bonding of wafer 540 to substrate 520 is accomplished without imagewise exposure but either a blanket exposure to begin the crosslinking reaction within the polymer 380 of if polymer 380 encompasses a thermal acid generating material, as previously discussed, no exposure is made and the bonding process is initiated through thermal means. It will be understood that after the completion of such processing, wafer 540 can be separated from substrate 520 through the thermal decomposition of polymer 580 as described above. It should be noted, however, that where an appropriate time for such decomposition is described, such time will be a function of, in pertinent part, the thickness of layer 380 and the size of wafer 540.

The coated, patterned, developed, and cured films of the present invention have superior properties such as a low dielectric constant, low moisture absorption, toughness, craze resistance to solvents, and adhesion among other properties. Polymer films with at least some of these properties are useful in the fabrication of microelectronic devices where high-density packaging, interconnection, and fine features such as microvias are required.

Layers formed from photodefinable polymer compositions in accordance with the present invention and cured and patterned layers, films and structures made using the methods described herein, together with their associated substrates, are useful as components of electrical and/or electronic devices as well as a variety of optoelectronic devices that can benefit from the high temperature stability and/or other properties of such films, layers and structures that are formed. In some exemplary embodiments, the electrical and/or microelectronic devices are semiconductor devices. In other exemplary embodiments, the electrical or electronic devices are selected from, but not limited to, logic chips such as microprocessor chips, passive devices, a memory chips, microelectromechanical system (MEMS) chips, a microoptoelectromechanical system (MOEMS) chips and application specific integrated circuit (ASIC) chips. In still other exemplary embodiments, optoelectronic devices such as display devices, light emitting diodes and plasma devices are included.

As will be seen in the following examples, provided for illustrative purposes only, embodiments of the present invention provide for polymers that can be tailored to provide the specific properties and characteristics of a broad range of applications. In addition, such examples illustrate various formulations of such polymers that can be employed to form structures useful in the manufacture of the aforementioned microelectronic and optoelectronic devices. The following are structural formulae of some of the materials used in the following examples.

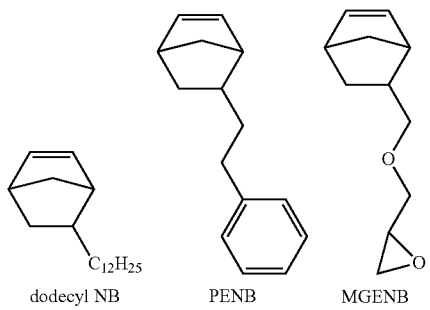

dodecyl NB    PENB    MGENB

-continued

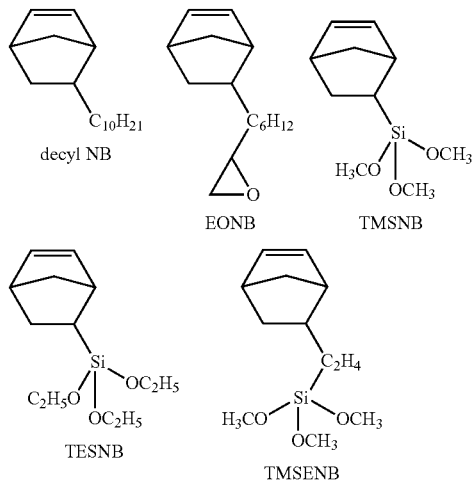

decyl NB    EONB    TMSNB

TESNB    TMSENB

The materials below are illustrative of additives generally employed to provide characteristics to polymer formulations of embodiments in accordance with the present invention that are advantageous in the manufacture of microelectronic and/or optoelectronic devices. It will be understood that such materials are illustrative of the types of materials that can be employed and that the scope and spirit of the instant application is meant to include other materials of such illustrated types of materials.

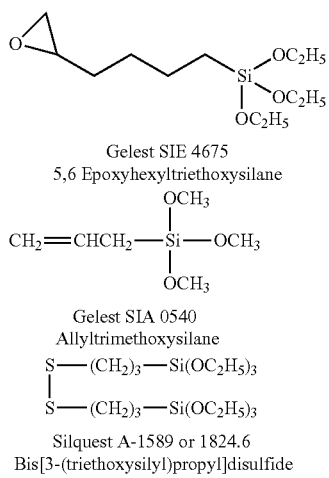

Gelest SIE 4675
5,6 Epoxyhexyltriethoxysilane $$CH_2=CHCH_2-Si(OCH_3)_3$$

Gelest SIA 0540
Allyltrimethoxysilane $$S-(CH_2)_3-Si(OC_2H_5)_3$$
$$|$$
$$S-(CH_2)_3-Si(OC_2H_5)_3$$

Silquest A-1589 or 1824.6
Bis[3-(triethoxysilyl)propyl]disulfide

Silquest A-187

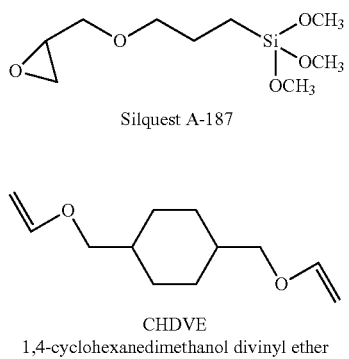

CHDVE
1,4-cyclohexanedimethanol divinyl ether

EXAMPLES

Polymer Synthesis Examples

Example 1

A polymer encompassing phenethyl, glycidyl methyl ether and decyl repeat units derived from phenethyl norbornene (PENB), glycidyl methyl ether norbornene (MGENB) and decyl norbornene (Decyl NB) was prepared as follows: An appropriate sized reaction vessel was dried at 110° C. for 18 hours and then transferred to a $N_2$ purged glovebox. The vessel was then charged with: ethyl acetate (230 g), cyclohexane (230 g), PENB (14.17 g, 0.071 mol); MGENB (14.0 g, 0.100 mol) and decyl NB (39.50 g, 0.168 mol). The reaction medium was purged of oxygen by passing a stream of dry $N_2$ through the solution for 30 minutes. After the purging was completed, 1.50 g (3.10 mmol) of bis(toluene)bis(perfluorophenyl) nickel (NiARF) dissolved in 8 ml of toluene was injected into the reactor. The reaction mixture was stirred for 18 hours at ambient temperature and then treated with a peracetic acid solution (50 molar equivalents based on the nickel catalyst—150 mmol prepared by combining 57 ml of glacial acetic acid diluted with approximately 130 ml deionized water with 115 mL of 30 wt. % hydrogen peroxide diluted with approximately 100 ml deionized water) and stirred for an additional 18 hours.

Stopping the stirring allowed the aqueous and solvent layers to separate. The aqueous layer was then removed and the remaining solvent layer washed three times with 500 mL of distilled water by adding an aliquot of water, stirring for 20 minutes, allowing the layers to separate and then removing the aqueous layer. The washed solvent layer was then added to an excess of acetone to precipitate the polymer which was recovered by filtration and dried overnight at 60° C. in a vacuum oven. After drying, 66.1 g of dry polymer (92% conversion) was obtained. The molecular weight of the polymer was determined by GPC using a polystyrene standard and found to be Mw=105,138, Mn=46,439 with the polydispersity (PDI) being 2.26. The composition of the polymer was determined using $^1$H NMR, and found to be: 20.2 mole percent (mol %) phenethyl norbornene; 29.1 mol % glycidyl methyl ether norbornene and 50.7 mol % decyl norbornene.

Examples 2-4

The procedure of Example 1 was repeated using the amounts of the several monomers indicated in Table 1, below. Appropriate amounts of solvents and catalyst were also employed.

Example 5

A polymer encompassing phenethyl, glycidyl methyl ether and decyl repeat units derived from PENB, MGENB and dodecyl norbornene (Dodecyl NB) was prepared as follows: An appropriately sized reaction vessel was charged with toluene (118.5 g), methyl ethyl ketone (MEK) (23.0 g), dodecyl NB (11.9 g; 0.045 m); MGENB (4.1 g; 0.023 m); and PENB (9.0 g; 0.045 m). The monomer solution was sparged with $N_2$ gas for 30 minutes while stirring to remove dissolved oxygen. After the sparging, NiARF catalyst (0.845 g; 0.0018 m) dissolved in toluene (12.0 g) was then added to the reaction vessel using a cannula. The polymerization reaction was conducted at ambient temperature for 6 hours and then treated with a solution of de-ionized water (100 g), hydrogen peroxide (50.0 g) and acetic acid (25.0 g) to quench the polymerization reaction. The resulting two phase reaction mixture was stirred at ambient temperature for an additional 18 hours to remove residual catalyst. The stirring was stopped to permit phase separation of the organic and aqueous phases, the aqueous phase decanted and the organic phase was washed 3 times with 200 mL of de-ionized water, 50 mL of THF was added to the first water wash to aid in phase separation of the aqueous and organic phases.

The polymer was recovered by precipitation into 7000 mL of methanol. The precipitated solid polymer was recovered by filtration, dried in air and then under vacuum at 45° C. for 48 hours. 23.5 g (94.0% yield) of solid polymer was recovered (Mn=35,581; Mw=80,273; PDI=2.25). The composition by $^1$H NMR was found to be dodecyl NB/MGENB/PENB (41/21/38).

Example 6

In an analogous manner to that of Example 5, a polymer encompassing phenethyl, epoxy octyl and decyl repeat units derived from PENB, epoxy octyl norbornene (EONB) and decyl NB was prepared using a monomer ratio of 40/30/30 respectively. 203.4 g (96.0% yield) of solid polymer was recovered (Mn=29,892; Mw=76,260; PDI=2.55). The composition was determined, by $^1$H NMR, to be PENB/EONB/decyl NB 40/30/30.

Example 7

In an alternate process, a 300 gallon PFA lined stainless steel reaction vessel was charged with 25.4 kilograms (kg) of PENB, 17.0 kg of MGENB, 22.8 kg of Decyl NB, 261.0 kg of cyclohexane and 261.0 kg of ethyl acetate. The reaction mix-

TABLE 1

| Ex | Monomers grams moles | | | Molecular weight | | | Composition ($^1$H NMR) | | |
|---|---|---|---|---|---|---|---|---|---|
| | Decyl NB | PENB | MGENB | Mn | Mw | PDI | Decyl NB | PENB | MGENB |
| 2 | 33.6 0.15 | 5.06 0.025 | 14.0 0.077 | 33,762 | 84,631 | 2.51 | 58.3 | 10.2 | 31.6 |
| 3 | 35.60 0.15 | 2.36 0.012 | 12.63 0.070 | 37,392 | 92,452 | 2.47 | 63.4 | 6.5 | 30.1 |
| 4 | 0 | 71.85 0.36 | 28.5 0.16 | 29,053 | 61,937 | 2.13 | 0 | 67.1 | 32.9 |

For Example 2, 49.2 g of dry polymer (90% conversion) was obtained; for Example 3, 44.8 g of dry polymer (89% conversion) was obtained; and for Example 4, 93.0 of dry copolymer (93% conversion) was obtained.

ture was then warmed to 30° C.+/−1° C. with stirring. After the temperature stabilized, a solution of 1.228 kg of NiARF dissolved in 29.48 kg of anhydrous toluene was added and a reaction exotherm was allowed to raise the temperature of the reaction vessel to 45° C. where it was maintained for five hours additional hours. The reaction mixture was then treated with a solution of 33 kg of acetic acid, 62.3 kg of 30% hydrogen peroxide and 71.8 kg of deionized water with stirring after which the mixture was allowed to separate into an aqueous phase and a solvent phase. The aqueous phase was removed and the solvent phase washed three times with a water and ethanol mixture (129.3 kg of water and 55.4 kg of ethanol) while maintaining the reaction mixture temperature at 50° C. The resulting polymer rich solvent phase was then treated with a mixture of alcohols to remove unreacted monomer, cooled to 4° C. and the upper alcohols layer removed. The product was then recovered as a solution in 2-heptanone (MAK) by solvent exchange and concentrated by vacuum distillation to approximately 50% polymer. 61.5 kg of polymer (94% theoretical yield) was obtained. $^1$H NMR analysis indicated the composition of the polymer to have incorporated: 41 mol % PENB, 29 mol % MGENB and 30 mol % Decyl NB. The molecular weight was found to be: Mn=33,137, Mw=70,697, and polydispersity index (PDI)=2.13.

Example 8

An appropriately sized reaction vessel was charged with cyclohexane (403.7 g), ethyl acetate (403.7 g), Decyl NB (54.80 g; 0.234 m); MGENB (29.74 g; 0.165 m); PENB (21.78 g; 0.110 m) and trimethxysilylnorbornene (TMSNB) (8.84 g; 0.041 m). The monomer solution was sparged with N2 gas for 30 minutes to remove dissolved oxygen.

In a glove box, 30 mL serum vial was charged with NiARF catalyst (4.44 g; 0.0092 m) and toluene (40.0 g). A magnetic stir bar was added to the serum vial, which was then sealed and removed from the glove box. The catalyst solution was stirred for 30 minutes to completely dissolve the catalyst in the toluene. The catalyst was then added to the monomer solution using a cannula. The polymerization reaction was conducted at ambient temperature for 5 hours.

A solution of de-ionized water (349.56 g), hydrogen peroxide (207.78 g) and acetic acid (110.0 g) was prepared. The aqueous solution was added to the 3 L reactor to quench the polymerization reaction. The 2 phase solution was stirred at ambient temperature for 18 hours to remove residual catalyst and then stirring was stopped to permit phase separation of the organic and aqueous phases. The aqueous phase was decanted and the organic phase was washed 5 times with 1500 mL of de-ionized water. 50 mL of THF was added to the first water wash to aid in phase separation of the aqueous and organic phases. The polymer was recovered by precipitation into 7000 mL of methanol. The precipitated solid polymer was recovered by filtration, dried in air and then under vacuum at 45° C. for 48 hours. 60.0 g (69.0% yield) of solid polymer was recovered (Mn=47,944 Mw=148,404 PDI=3.095).

Examples 9-11

The procedure of Example 6 was repeated using the amounts of the several monomers indicated in Table 2, below. Appropriate amounts of solvents and catalyst were also employed and as noted in the table, an alternate silyl ether norbornene monomer were used in each of Examples 7 and 9 as identified in the key following the table.

TABLE 2

| | Monomer Feed Ratio (mol %) | | | | Molecular weight | | | Composition ($^{13}$C NMR and/or $^1$H NMR) | | | |
|---|---|---|---|---|---|---|---|---|---|---|---|
| Ex | Decyl NB | MGENB | PENB | Silyl ether NB | Mn | Mw | PDI | Decyl NB | MGENB | PENB | Silyl ether NB |
| 8 | 42.5 | 30 | 20 | 7.5 * | 47,944 | 148,404 | 3.095 | | | | |
| 9 | 30 | 30 | 35 | 5 ** | 68,000 | 25,850 | 2.63 | 29 | 28 | 38 | 5 |
| 10 | 30 | 30 | 35 | 5 * | 84,300 | 28,100 | 3.00 | | | | |
| 11 | 42.5 | 30 | 20 | 7.5 *** | 80,000 | 35,000 | 2.30 | 44 | 28 | 22 | 6 |

Key to alternate silyl ether nobornenes
* Trimethoxysilyl norbornene (TMSNB)
** Triethoxysilyl norbornene (TESNB)
*** Trimethoxysilyl ethyl norbornene (TMSENB)

Formulation and Process Examples

Example A

An amber wide neck bottle was charged with 101.0 g of a polymer solution prepared as in Example 5 and 50 g of 2-heptanone (MAK). The solution was mixed until the solid polymer was completely dissolved and then filtered through a 0.45 micron filter to remove particles. To the solution was added 2.00 g (1.97 mmol) of Rhodorsil® PI2074 photoinitiator, 0.60 g (1.97 mmol) of Speedcure® CTPX (Lambson Group Ltd.) 0.137 g (0.688 mmol) phenothiazine (Aldrich) and 2.657 g of Irganox 1076 (5.00 mmol). The solution is mixed for 18 hours to completely disperse the photoactive compounds.

A 5 inch oxynitride coated silicon wafer is spin coated with 4.0 g of the polymer solution. The resulting coating is first baked at 120° C. on a hot plate for 4 minutes. The film is patterned by imagewise exposing to 300 mJ/cm2 of UV radiation (365 nm). The resulting pattern in the polymer film is enhanced by second heating the wafer in a nitrogen oven at 90° C. for 5 minutes. The pattern is developed in a spin developer by spraying the film with cyclopentanone for 120 seconds to dissolve the unexposed regions of the film. The wet film is then rinsed with propylene glycol monomethyl ether acetate (PGMEA) for 30 seconds and cured for 60 minutes at 250° C. under a nitrogen atmosphere.

Example B

An amber wide neck bottle was charged with 191.25 g of a polymer material prepared as in Example 1 and 191 g of 2-heptanone (MAK). The solution was mixed until the solid polymer was completely dissolved and then filtered through a 0.45 micron filter to remove particles. To the solution was added 3.825 g (3.77 mmol) of Rhodorsil® PI2074 photoinitiator, 1.148 g (3.77 mmol) of Speedcure® CTPX (Lambson Group Ltd.), 0.262 g (1.32 mmol) phenothiazine (Aldrich) and 3.73 g (7.03 mmol) of Irganox 1076 (Ciba). The solution is mixed for 18 hours to completely disperse the photoactive compounds.

A 5 inch oxynitride coated silicon wafer is spin coated with 4.0 g of the polymer solution above and processed as described in Example A to form an imaged polymer layer.

Example C

An amber wide neck bottle was charged with 37.5 g of a polymer material prepared as in Example 1 and 37.5 g of 2-heptanone (MAK). The solution was mixed until the solid polymer was completely dissolved and then filtered through a 0.45 micron filter to remove particles. To the solution was added 0.9840 g (0.97 mmol) of Rhodorsil® PI2074 photoinitiator, 0.297 g (0.97 mmol) of Speedcure® CTPX (Lambson Group Ltd.), 0.070 g (0.35 mmol) phenothiazine (Aldrich), 0.73 g (1.38 mmol) of Irganox 1076 (Ciba Fine Chemicals), 2.46 g (10.4 mmol) 3-glycidoxylpropyl trimethoxysilane (Aldrich), and 1.25 g (6.36 mmol) 1,4-cyclohexane dimethanol divinyl ether. The solution is mixed for 18 hours to completely disperse the photoactive compounds.

A 5 inch oxynitride coated silicon wafer is spin coated with 4.0 g of the polymer solution above and processed as described in Example A to form an imaged polymer layer.

Example D

An amber wide neck bottle was charged with 33.2 g of a polymer material prepared as in Example 4 and 47.6 g of 2-heptanone (MAK). The solution was mixed until the solid polymer was completely dissolved and then filtered through a 0.45 micron filter to remove particles. To the solution was added 0.664 g (0.65 mmol) of Rhodorsil® PI2074 photoinitiator, 0.203 g (0.668 mmol) of Speedcure® CTPX (Lambson Group Ltd.) 0.051 g (0.256 mmol) phenothiazine (Aldrich), 0.499 g of Irganox 1076 (0.939 mmol), 1.667 g (7.2 mmol) 3-glycidoxylpropyl trimethoxysilane (Aldrich), and 0.831 g (4.23 mmol) 1,4-cyclohexane dimethanol divinyl ether. The solution was mixed for 18 hours to completely disperse the photoactive compounds.

A 5 inch oxynitride coated silicon wafer is spin coated with 4.0 g of the polymer solution above and processed as described in Example A to form an imaged polymer layer except that the first bake was at 110° C. and the exposure energy was at 400 mJ/cm$^2$

Examples E-N

Table 3, below, demonstrates the measured Die Shear Strength of test samples prepared for such measurements. Each of these polymer compositions of Examples E through N was prepared in the manner of Example A except that the specific polymer used varies as indicated in the table and the specific amounts of, Rhodosil, CTPX, phenothiazine and Irganox used were, in parts per hundred of the polymer, 2.0, 0.6, 0.14 and 1.5, respectively. Where other additives were included in any composition, such materials and the amounts used are presented in the "Additional Additives" column of Table 3 below (the chemical structures for these additives are provided in the list of such structures previously presented). The Die Shear Strength measurements were performed, as previously discussed, using a low bond pressure, 0.1 MPa and a high bond pressure, 0.7 MPa. For both pressures the test sample were heated to 170° C. and the pressure applied for 2 minutes. The measurements were made after the test samples returned to ambient temperature.

TABLE 3

| | | Additional Additives | Die Shear Strength (MPa) | |
|---|---|---|---|---|
| Ex | Polymer from: | (parts/hundred - Additive) | Low Bond Pressure | High Bond Pressure |
| E | Example 7 | 5.0 - SID4675 | 24.61 | 17.20 |
| F | Example 7 | 5.0 - SID0540 | 21.10 | 13.96 |
| G | Example 7 | 5.0 - A-1589 | 14.70 | 14.15 |
| H | Example 7 | 5.0 - SIB1824.6 | 24.61 | 17.20 |
| I | Example 8 | | 22.98 | 20.88 |
| J | Example 9 | | 14.53 | 19.79 |
| K | Example 10 | | 15.04 | 17.41 |
| L | Example 11 | | 17.32 | 20.75 |
| M | Example 5 | 2.5 - CHDVE, 5.0 - A-187 | 10.90 | 20.60 |
| N | Example 6 | 2.5 - CHDVE, 5.0 - A-187 | 10.22 | 11.24 |

It should be noted that while the time, temperature and pressure used for preparing the samples of Experiments E through N are shorter and lower than what might be generally employed, the shear strength reported is close to the point of substrate failure and not bond failure. That is to say, the point at which the material being bonded fails but the bond does not. Further it should be noted that final bond shear strength achieved through a full bond and cure process is expected to be higher then what is reported in Table 3.

By now it should be understood that the embodiments of the present invention present methods for using the described polymer compositions in an advantageous and novel method. It will further be understood that such methods, and the polymer compositions thereof, are not limited to any of the particular embodiments disclosed, but rather that as such disclosure defines the scope and spirit of the invention, such invention is intended to cover modifications of the methods and compositions disclosed, where such are within the spirit and scope of the invention, as defined by the appended claims.

Therefore, we claim:

1. A semiconductor device having a sensor array or image sensing portion therein, the device comprising:
   a patterned polymer formed on the semiconductor device proximate the sensor array or image sensing portion, said patterned polymer consisting of a norbornene-type polymer comprising at least a first and a second type of repeating unit, said first type being derived from PENB and represented by formula I and said second type being derived from decylNB and represented by formula II; and

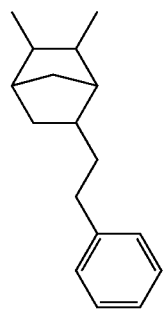

I

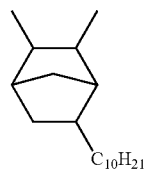

II a cover comprising glass or plastic, said cover being fixedly coupled to the patterned polymer, where said patterned polymer maintains said cover in spaced relation from the sensor array or image sensing portion and fixedly attaches said cover to said semiconductor device.

2. The polymer composition of claim 1 further comprising at least one of a glycidyl methyl ether repeat unit derived from glycidyl methyl ether norbornene (GMENB) or an epoxy octyl repeat unit derived from epoxy octyl norbornene (EONB).

3. The polymer composition of claim 1 further comprising a glycidyl methyl ether repeat unit derived from glycidyl methyl ether norbornene (GMENB).

4. The polymer composition of claim 1 further comprising an epoxy octyl repeat unit derived from epoxy octyl norbornene (EONB).

5. The polymer composition of claim 2 further comprising a repeat unit derived from a norbornene-type monomer having a $C_1$ to $C_{25}$ linear, branched or cyclic alkyl, aryl, aralkyl, alkaryl, alkenyl, and alkynyl pendent group containing one or more hetero atoms selected from O, N, and Si.

6. The polymer composition of claim 5 where the norbornene-type monomer comprises at least one of trimethoxysilyl norbornene (TMSNB), triethoxysilyl norbornene (TESNB), or trimethoxysilyl ester norbornene (TMSESNB).

7. The semiconductor device of claim 1 where the structure deposed proximate the sensor array or image sensing portion comprises a polymer composition comprising a norbornene-type polymer having a first, a second, and a third distinct type of repeat unit; said first distinct type of repeat unit being derived from glycidyl methyl ether norbornene (GMENB) or epoxy octyl norbornene (EONB) and being encompassed within the polymer composition in an amount from 10 to 40 mol %; said second distinct type of repeat unit being derived from phenethyl norbornene (PENB) and being encompassed within the polymer composition in an amount from 5 to 50 mol %; and said third distinct type of repeat unit being derived from decyl norbornene (decyl NB) or dodecyl norbornene (dodecyl NB) and being encompassed within the polymer composition in an amount from 20 to 65 mol %, such mol % ranges being based on the total mole percent of the monomers used to form the polymer.

8. The norbornene-type polymer of claim 7 where the first distinct type of repeat unit is derived from glycidyl methyl ether norbornene.

9. The norbornene-type polymer of claim 7 where the third distinct type of repeat unit is derived from decyl norbornene.

10. The norbornene-type polymer of claim 7 further comprising a fourth distinct type of repeat unit derived from triethoxysilyl norbornene and encompassed within the polymer composition in an amount from 2 to 15 mol %.

11. The semiconductor device of claim 1, where said patterned polymer further comprises a third type of repeating unit derived from MGENB and represented by formula III or derived from EONB and represented by formula IV:

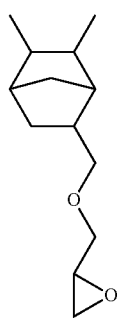

III

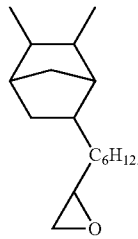

IV

12. The semiconductor device of claim 1 or 11, where said patterned polymer is a dielectric patterned polymer.

* * * * *

UNITED STATES PATENT AND TRADEMARK OFFICE
CERTIFICATE OF CORRECTION

PATENT NO. : 8,120,168 B2
APPLICATION NO. : 11/903190
DATED : February 21, 2012
INVENTOR(S) : Chris Apanius et al.

Page 1 of 1

It is certified that error appears in the above-identified patent and that said Letters Patent is hereby corrected as shown below:

Column 30, Line 44, Claim 1, delete "decylNB" and insert -- decyl NB --

Signed and Sealed this
Eighth Day of May, 2012

David J. Kappos
*Director of the United States Patent and Trademark Office*